United States Patent [19]
Kondo et al.

[11] Patent Number: 5,825,313
[45] Date of Patent: Oct. 20, 1998

[54] INFORMATION SIGNAL ENCODING APPARATUS, ENCODING METHOD THEREOF, INFORMATION SIGNAL DECODING METHOD, AND INFORMATION SIGNAL RECORD MEDIUM THEREOF

[75] Inventors: Tetsujiro Kondo; Yasuhiro Fujimori; Kenji Takahashi; Kunio Kawaguchi, all of Kanagawa, Japan

[73] Assignee: Sony Corporation, Tokyo, Japan

[21] Appl. No.: 691,111

[22] Filed: Aug. 1, 1996

[30] Foreign Application Priority Data

Aug. 1, 1995 [JP] Japan ................................ 7-215150

[51] Int. Cl.⁶ ............................................ H03M 7/40
[52] U.S. Cl. ................................ 341/67; 348/421
[58] Field of Search ........................ 341/50, 67; 348/405, 348/408, 409, 415, 420, 421; 358/261.1, 261.2, 261.3, 427; 386/109, 111

[56] References Cited

U.S. PATENT DOCUMENTS

| 5,023,710 | 6/1991 | Kondo et al. | 358/133 |
|---|---|---|---|
| 5,049,990 | 9/1991 | Kondo et al. | 358/133 |
| 5,301,032 | 4/1994 | Hong et al. | 358/261.2 |
| 5,428,396 | 6/1995 | Yagasaki et al. | 348/416 |
| 5,495,298 | 2/1996 | Uchida et al. | 348/615 |
| 5,497,298 | 3/1996 | Jeong | 341/67 |
| 5,602,549 | 2/1997 | Jeong | 341/67 |
| 5,608,398 | 3/1997 | Hashimoto et al. | 341/76 |

*Primary Examiner*—Marc S. Hoff
*Attorney, Agent, or Firm*—Frommer lawrence & Haug LLP; William S. Fromer

[57] ABSTRACT

Difference signals generated by the prediction encoding process for an input digital information signal are block segmented and then quantized by an ADRC encoder as a first variable-length-code encoding means. Output data of the ADRC encoder is divided into bit planes by a bit plane encoding circuit. The ADRC encoder varies the number of bits assigned to a block corresponding to a dynamic range DR. A block to which 0 bit has been assigned is detected in each bit plane and data of the block is excluded. The resultant data is encoded by a variable-length-code encoder as a second variable-length-code encoding means and then transmitted.

44 Claims, 12 Drawing Sheets

Fig. 3A
| a | b | c | d | | | |
| e | f | A | B | C | D | |
| g | h | E | F | G | H | |
| | | I | J | K | L | |
| | | M | N | O | P | |
| | | | | | | |
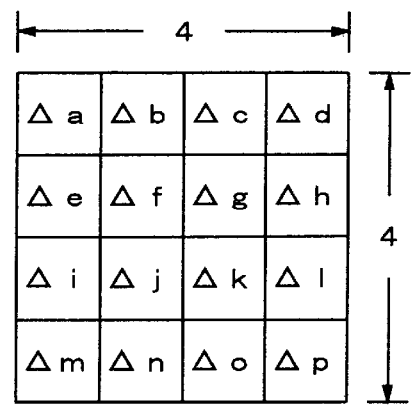
Fig. 3B
Fig. 5
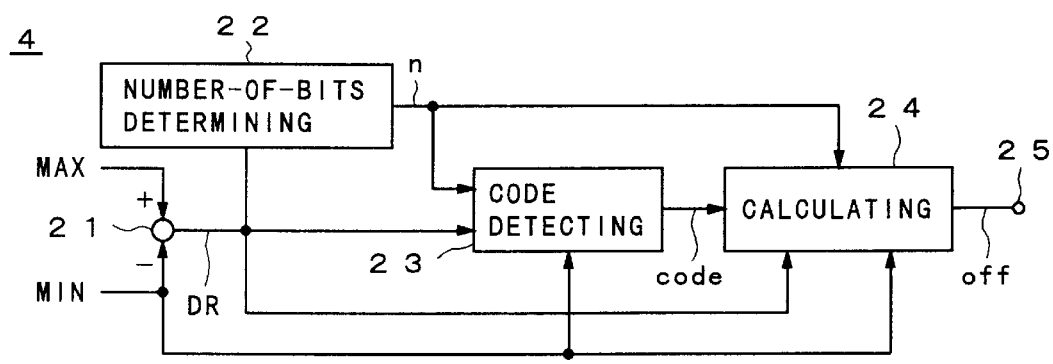
Fig. 6
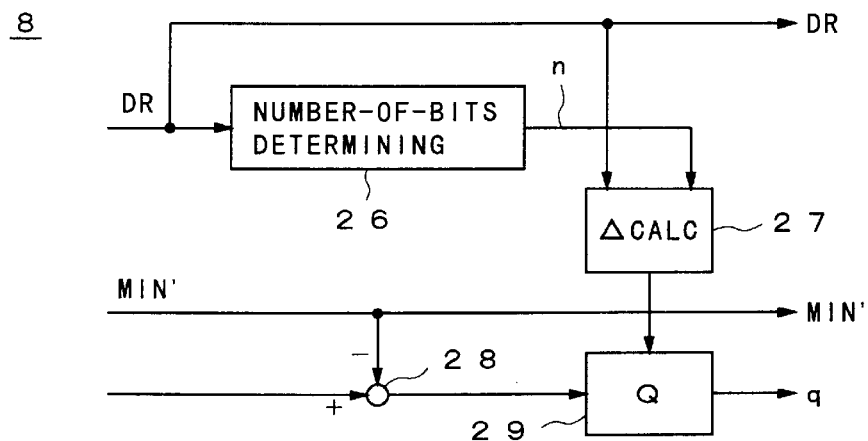

Fig. 7A
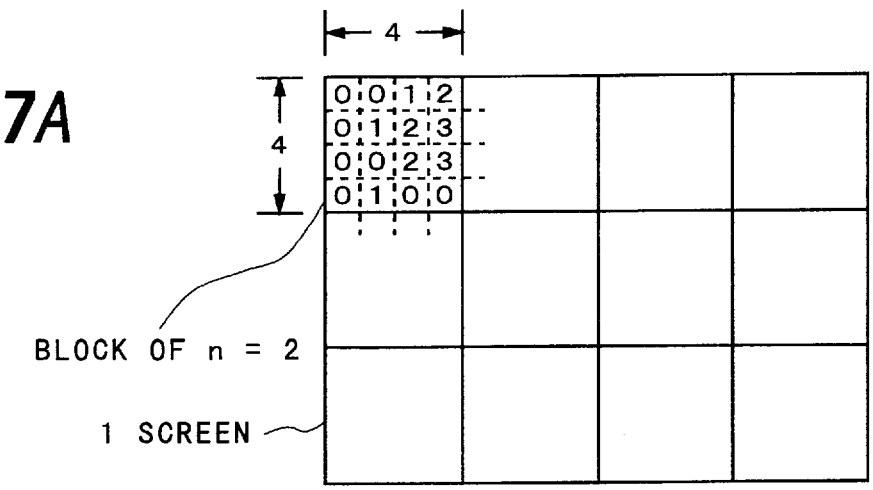
BLOCK OF n = 2
1 SCREEN
Fig. 7B
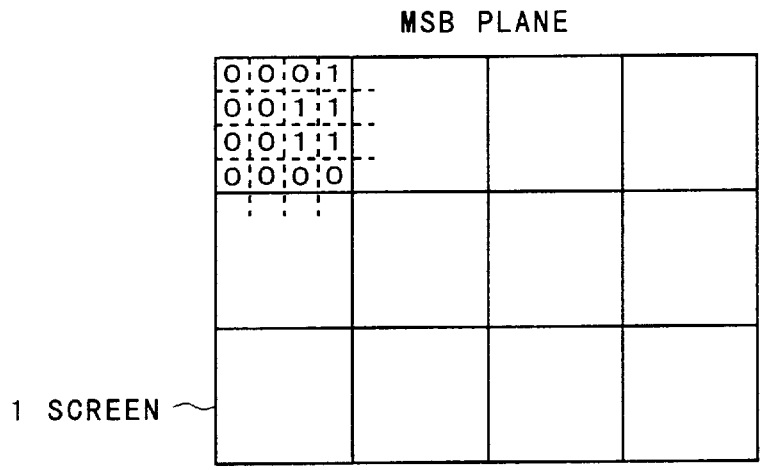
1 SCREEN
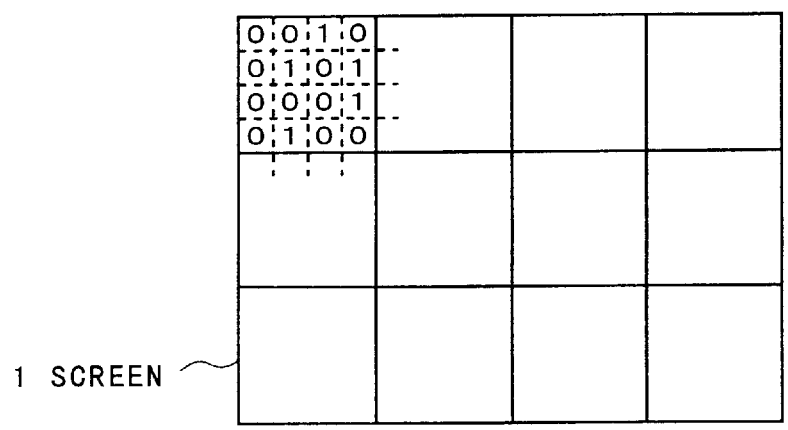
1 SCREEN

Fig. 8A
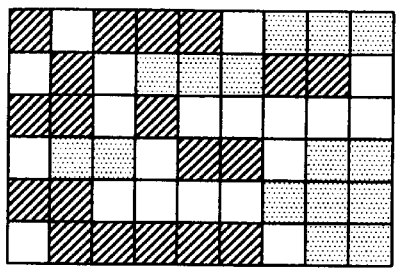
▨ 2 BITS ASSIGNED
▦ 1 BIT ASSIGNED
☐ 0 BIT ASSIGNED
Fig. 8B
MSB PLANE 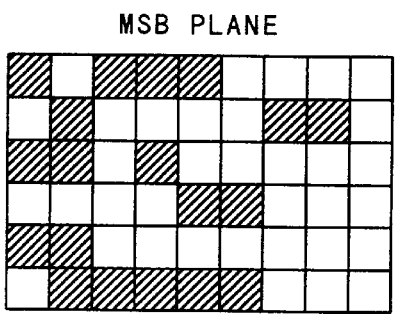   LSB PLANE 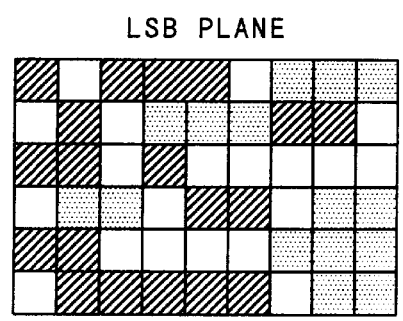
Fig. 8C
MSB PLANE 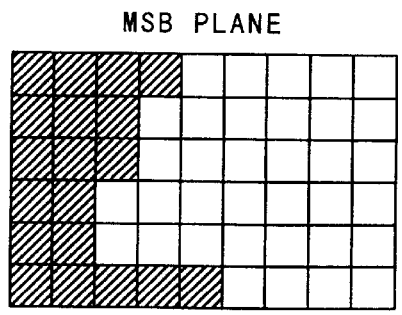   LSB PLANE 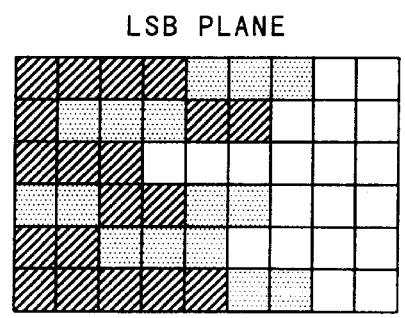

Fig. 11
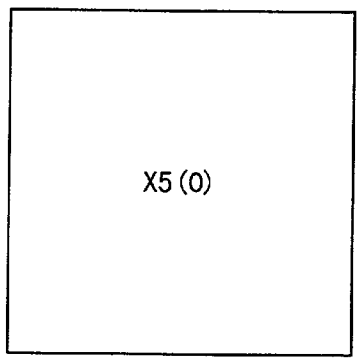
FIFTH HIERARCHICAL LEVEL,
BLOCK SIZE (1/16 × 1/16)
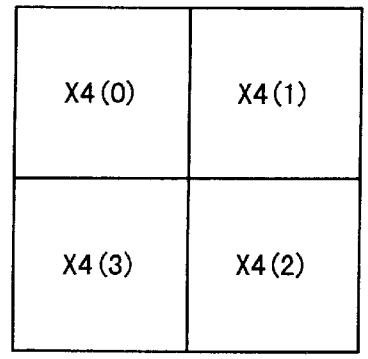
FOURTH HIERARCHICAL LEVEL,
BLOCK SIZE (1/8 × 1/8)
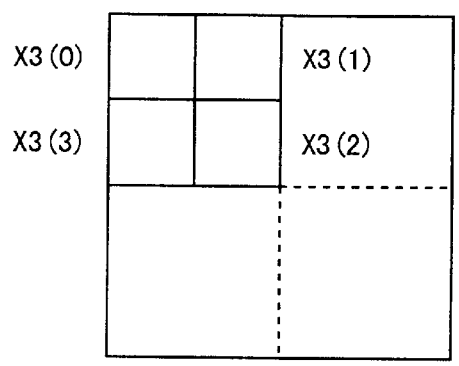
THIRD HIERARCHICAL LEVEL,
BLOCK SIZE (1/4 × 1/4)
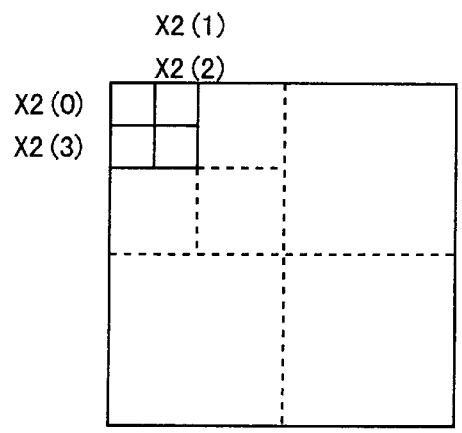
SECOND HIERARCHICAL LEVEL,
BLOCK SIZE (1/2 × 1/2)
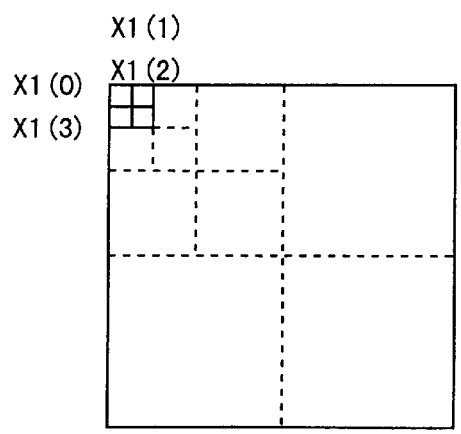
FIRST HIERARCHICAL LEVEL,
BLOCK SIZE (1 × 1)

INFORMATION SIGNAL ENCODING APPARATUS, ENCODING METHOD THEREOF, INFORMATION SIGNAL DECODING METHOD, AND INFORMATION SIGNAL RECORD MEDIUM THEREOF

BACKGROUND OF THE INVENTION

1. Field of the Invention

The present invention relates to an information signal encoding apparatus for reducing the amount of generated data of digital information signals such as a digital audio signal and a digital picture signal, an encoding method thereof, a decoding method thereof, and an information signal record medium.

2. Description of Related Art

A variety of prediction encoding methods for decreasing the amount of transmission information such as a digital audio signal and a digital picture signal are known. As an example, in the one-dimensional DPCM method, the difference between an input sample value and a predicted value is formed in the temporal direction. In the two-dimensional DPCM method, the difference between an input sample value and a predicted value is formed in the spatial direction. Since the digital information signal has correlation in the temporal direction and the spatial direction, the difference concentrates to nearly 0. Thus, since a difference signal is quantized with smaller quantizing bits than before, the amount of digital information signals can be correspondingly compressed. In addition, using the characteristic of the concentration of the distribution of the difference signal, the digital information signal can be encoded with a variable length code, thereby further compressing the amount of information.

As examples of the variable-length-code encoding method, the run-length code encoding method and the Huffman-code encoding method are known. In addition, as an example of the variable-length-code encoding method for the difference signal, a combination of the bit-plane encoding method and the variable-length-code encoding method has been proposed. In the bit-plane encoding method, bits of the same digit of a plurality of pieces of data are collected and thereby bit planes are formed. The variable-length-code encoding method such as the run-length-code encoding method or the Huffman-code encoding method is performed for each bit plane.

As an example of the method for quantizing the difference signal, a method for varying the number of quantizing bits corresponding to the dynamic range of each block of the difference signal is known. In other words, when the dynamic range of a block is small, the number of quantizing bits is described so as to decrease the amount of information. The minimum number of quantizing bits is 0. When the number of quantizing bits has been assigned 0 bit, no data of the difference signal is transmitted. However, in the conventional variable-length-code encoding method for each bit plane, data of blocks of which the number of quantizing bits has been assigned 0 bit is also encoded. Thus, even if the variable-length-code encoding method such as the run-length-code encoding method is performed, the compressing ratio cannot be satisfactorily increased.

OBJECT AND SUMMARY OF THE INVENTION

Therefore, an object of the present invention is to provide an information signal encoding apparatus for variable-length-code encoding each bit plane with a high compression ratio, an encoding method thereof, an information signal decoding method thereof, and an information signal record medium thereof.

A first aspect of the present invention is an information signal encoding apparatus for encoding an input digital information signal in such a manner that the amount of data generated decreases, comprising a means for generating a difference signal representing the difference between sample values of the input digital information signal, a means for block segmenting the difference signal, a first variable-length-code encoding means for quantizing the block segmented difference signal with the number of quantizing bits determined for each block, and a second variable-length-code encoding means for dividing output data of the first variable-length-code encoding means into bit planes, removing data of each block to which 0 bit is assigned of each of the bit planes corresponding to information defining the number of quantizing bits of the first variable-length-code encoding means, and variable-length-code encoding the resultant bit planes.

A second aspect of the present invention is an information signal encoding method for encoding an input digital information signal in such a manner that the amount of data generated decreases, comprising the steps of (a) generating a difference signal representing the difference between sample values of the input digital information signal, (b) block segmenting the difference signal, (c) quantizing the block segmented difference signal with the number of quantizing bits determined for each block, and (d) dividing output data of the step (c) into bit planes, removing data of each block to which 0 bit is assigned of each of the bit planes corresponding to information defining the number of quantizing bits of said first variable-length-code encoding means, and variable-length-code encoding the resultant bit planes.

A third aspect of the present invention is an information signal encoding apparatus for generating at least first hierarchical data and second hierarchical data by an input digital information signal, encoding the first hierarchical data and the second hierarchical data, and transmitting the encoded data, comprising a means for forming the second hierarchical data with a resolution lower than the first hierarchical data, a means for predicting the first hierarchical data with the second hierarchical data, a means for forming a difference signal representing the difference between the predicted data and the first hierarchical data, a means for block segmenting the difference signal, a first variable-length-code encoding means for quantizing the block segmented difference signal with the number of quantizing bits determined for each of blocks, and a second variable-length-code encoding means for dividing output data of the first variable-length-code encoding means into bit planes, removing data of each block to which 0 bit is assigned of each of the bit planes corresponding to information defining the number of quantizing bits of the first variable-length-code encoding means, and variable-length-code encoding the resultant bit planes.

A fourth aspect of the present invention is an information signal encoding method for generating at least first hierarchical data and second hierarchical data by an input digital information signal, encoding the first hierarchical data and the second hierarchical data, and transmitting the encoded data, comprising the steps of (a) forming the second hierarchical data with a resolution lower than the first hierarchical data, (b) predicting the first hierarchical data with the second hierarchical data, (c) forming a difference signal representing the difference between the predicted data and the first hierarchical data, (d) block segmenting the difference signal, (e) quantizing the block segmented difference signal with the number of quantizing bits determined for each of blocks, and (f) dividing output data of the step (e) into bit planes, removing data of each block to which 0 bit is assigned of each of the bit planes corresponding to information defining the number of quantizing bits of the step (e), and variable-length-code encoding the resultant bit planes.

A fifth aspect of the present invention is an information signal decoding method for decoding an encoded difference signal of which a difference signal has been quantized by a first variable-length-code encoding process and each of bit planes of the encoded difference signal has been encoded by a second variable-length-code encoding process, comprising the steps of (a) decoding data of a 0-bit assigned block that has been removed in each of the bit planes corresponding to information defining the number of quantizing bits of the first variable-length-code encoding process, decoding the variable length code, and compositing the decoded bit planes, (b) variable-length-code decoding the data of the composited bit planes, and (c) block-desegmenting the decoded difference signal and restoring data of the original sequence.

A sixth aspect of the present invention is a picture record medium for recording an encoded signal of which an input digital information signal has been encoded in such a manner that the amount of data generated decreases, the picture record medium having a record region for recording the encoded signal, the encoded signal being generated by an information signal encoding apparatus, the information signal encoding apparatus comprising a means for generating a difference signal representing the difference between sample values of the input digital information signal, a means for block segmenting the difference signal, a first variable-length-code encoding means for quantizing the block segmented difference signal with the number of quantizing bits determined for each block, and a second variable-length-code encoding means for dividing output data of the first variable-length-code encoding means into bit planes, removing data of each block to which 0 bit is assigned of each of the bit planes corresponding to information defining the number of quantizing bits of the first variable-length-code encoding means, and variable-length-code encoding the resultant bit planes.

According to the present invention, a difference signal representing the difference between a digital picture signal as an input digital information signal and a predicted signal is block segmented and variable-length-code encoded in such a manner that the number of quantizing bits to be assigned varies block by block. Encoded output data of for example one screen is converted into a set of bit planes. In the set of bit planes, bits of all planes corresponding to blocks of which the number of quantizing bits has been assigned 0 bit are always '0'. Thus, before a signal is variable-length-code encoded, blocks of which the number of quantizing bits has been assigned 0 bit are removed. Consequently, the amount of data to be transmitted can be decreased.

These and other objects, features and advantages of the present invention will become more apparent in light of the following detailed description of best mode embodiments thereof, as illustrated in the accompanying drawings.

BRIEF DESCRIPTION OF THE DRAWINGS

FIGS. 3A and 3B are schematic diagrams for explaining generation and block segmentation of a difference signal according to the embodiment of the present invention;

FIG. 5 is a block diagram showing an example of the structure of an offset detecting circuit according to the embodiment of the present invention;

FIG. 6 is a block diagram showing an example of the structure of an ADRC encoder according to the embodiment of the present invention;

FIGS. 7A and 7B are schematic diagrams for explaining bit planes according to the embodiment of the present invention;

FIGS. 8A, 8B, and 8C are schematic diagrams for explaining a process for removing 0 data according to the embodiment of the present invention;

FIG. 11 is a schematic diagram for explaining an example of the hierarchical encoding process;

DETAILED DESCRIPTION OF PREFERRED EMBODIMENTS

Figure 1:
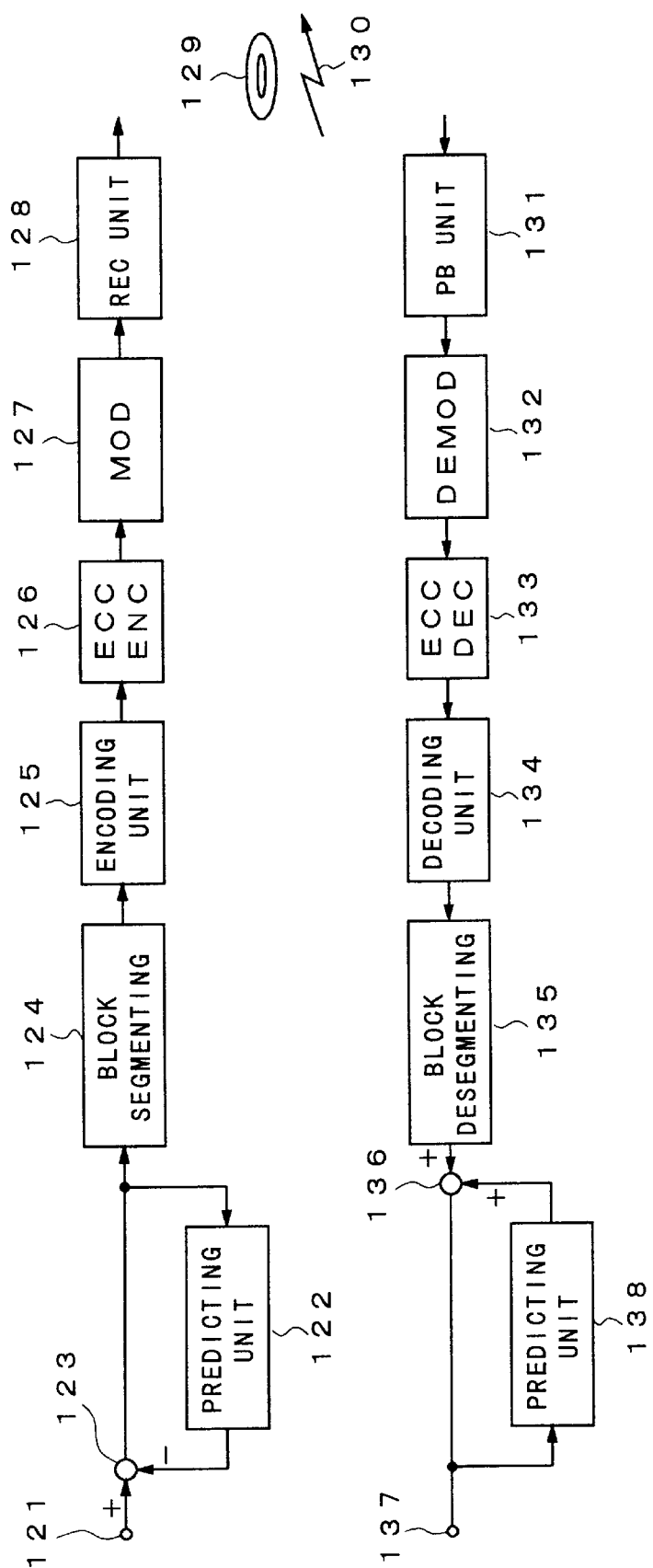
FIG. 1 is a block diagram showing an example of the structure of a recording/reproducing system or a transmitting system according to the present invention.

Next, with reference to the accompanying drawings, embodiments of the present invention will be described. The present embodiment is applied for a digital picture signal of which a video signal has been sampled at a predetermined sampling frequency and each sample has been converted into a predetermined number of quantizing bits. FIG. 1 shows the overall structure of the system according to the embodiment of the present invention.

In FIG. 1, a digital video signal is supplied to an input terminal 121. The input signal is supplied to a subtracting unit 123. The output signal (difference signal) of the subtracting unit 123 is supplied to a block segmenting circuit 124 and a predicting unit 122. The predicting unit 122 generates a predicted signal and supplies it to the subtracting unit 123. The subtracting unit 123 subtracts the predicted signal from the input signal and generates a predicted difference. The predicted difference is supplied as a difference signal to the block segmenting circuit 124. The block segmenting circuit 124 converts data of raster scanning sequence into data of block sequence. The block segmented difference signal is supplied to an encoding unit 125.

As will be described later, the encoding unit performs a first variable-length-code encoding process and a second variable-length-code encoding process. In the first variable-length-code encoding process, the difference signal is requantized with quantizing bits smaller than quantizing bits of the former quantizing process. In the second variable-length-code encoding process, the quantized data is divided into bit planes and data thereof is variable-length-code encoded. In addition to the requantizing process, the encoding unit 125 compensates data so that the value 0 of the difference signal is restored to the value 0.

The encoded output data of the encoding unit 125 is supplied to an error-correction-code encoder 126. The error-correction-code encoder 126 adds a redundant code for the error-correction-code encoding process to the output data of the encoding unit 125. The output data of the error-correction-code encoder 126 is supplied to a modulating portion 127. The modulating portion 127 modulates the digital signal as the output signal of the error-correction-code encoder 126 into a format of which the digital signal can be recorded or transmitted. The output signal of the modulating portion 127 is supplied to a recording unit 128. The recording unit 128 records the record signal on an information signal record medium 129. Alternatively, data can be transmitted through a transmission path 130. In this case, a transmitting unit is used instead of the recording unit 128. The information signal record medium 129 is a disc-shaped or tape-shaped record medium corresponding to the magnetic recording method, the magneto optical recording method, the phase change recording method, or the like. In addition, a semiconductor memory is a kine of record medium.

Data recorded on the record medium 129 is reproduced (played back) by a reproducing unit (or playback unit) 131. Alternatively, data is received through the transmission path 130. The output data of the reproducing unit 131 is supplied to a demodulating portion 132. The demodulating portion 132 demodulates the output data of the reproducing unit 131. The output data (demodulated data) of the demodulating portion 132 is supplied to an error-correction-code decoder 133. The decoder 133 corrects an error of the demodulated data with a redundant code. When the decoder 133 cannot correct an error of the demodulated data, the decoder 133 quietly trims the error.

The output data of the error-correction-code decoder 133 is supplied to a decoding unit 134. As will be described later, the decoding unit 134 performs the variable-length-code decoding process (that is the reverse process of the encoding unit 125) and the dequantizing process. The decoding unit 134 generates a decoded difference signal. The decoded difference signal is supplied to a block desegmenting circuit 135. The block desegmenting circuit 135 restores the data of block sequence to the data of raster scanning sequence.

The decoded difference signal is supplied to an adding circuit 136. The adding circuit 136 generates a decoded picture signal. The decoded picture signal is obtained from an output terminal 137. In addition, the decoded picture signal is supplied to a predicting unit 138. The predicting unit 138 generates a predicted signal. The predicted signal is supplied to the adding circuit 136.

Figure 2:
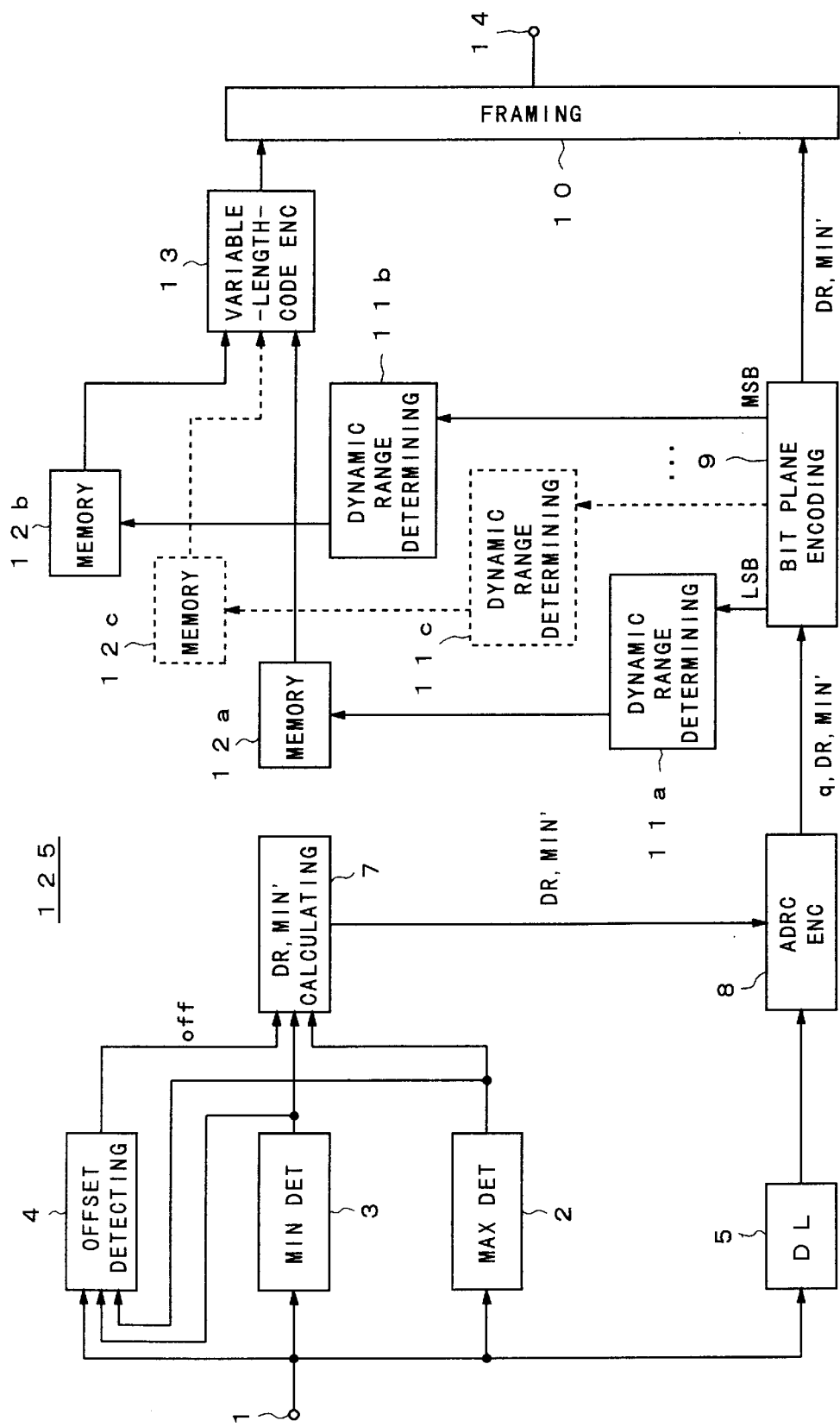
FIG. 2 is a block diagram showing an embodiment of the present invention.

FIG. 2 shows an example of the structure of the encoding unit 125. A block segmented difference signal is supplied from the block segmenting circuit 124 to an input terminal 1. FIGS. 3A and 3B schematically show the structures of difference signals. Each square in FIG. 3A corresponds to one pixel. In FIG. 3A, letters a to h represent locally decoded pixel values. Letters A to P represent pixel values that have not been encoded. A predicted value A' of a pixel value A is generated with adjacent locally-decoded pixel values by the predicting unit 122. For example, the predicted value A' is formed corresponding to a predicting formula as in A'=4c −3(b −f), A'=f+c−b, or the like. The predicted values of the pixel values B, C, and so forth are calculated with such predicting formulas. A predicted value is generally formed by a formula $\alpha a + \beta b + \gamma f$ where $\alpha$, $\beta$, and $\gamma$ are constants.

The subtracting unit 123 subtracts a predicted value (for example, A') from a pixel value (for example, A) and generates a difference signal $\Delta a$. Likewise, the subtracting unit 123 generates difference signals $\Delta b$, $\Delta c$, and so forth. The block segmenting circuit 124 converts the generated difference signals into a block. For example, as represented by a box of solid lines, data of a block composed of difference signals $\Delta a$ to $\Delta p$ corresponding to a block composed of (4×4) pixels is formed. When a digital audio signal is used, predicted values in the temporal direction are formed and thereby blocks of one-dimensional difference signals are formed.

When the difference signals are block segmented, the concentration of the range of levels of the difference signals can be increased. When one pixel is composed of eight bits of data, the distribution of the frequency of difference signals of one screen ranges from −255 to +255 with the center of 0. Thus, the frequency of which the difference is 0 is maximum. However, when the difference signals are block segmented, the distribution of levels of the difference signals is higher than the original distribution. In addition, when the difference signals are block segmented, the maximum frequency of the difference signals is not always 0.

This is because the values of the difference signals of blocks in a narrow space are smaller than those of one screen in probability. In addition, the values of the difference signals of blocks have strong correlation. When the levels of the brightness of blocks gradually vary in for example the diagonal direction, the frequency of the value 0 does not become maximum. The concentration of the distribution of levels of the difference signals can be also increased by another method rather than the block segmenting method.

Returning back to FIG. 2, the encoding unit 125 will be described. Difference signals are supplied from the input terminal 1 to a maximum value detecting circuit 2, a minimum value detecting circuit 3, an offset detecting circuit 4, and a delaying circuit 5. The maximum value detecting circuit 2 detects a maximum value MAX of each block. In contrast, the minimum value detecting circuit 3 detects a minimum value MIN of each block. The detected maximum value MAX and minimum value MIN are supplied to the offset detecting circuit 4 and a DR, MIN' calculating circuit 7.

The block-segmented difference signals, the maximum value MAX, and the minimum value MIN are supplied to the offset detecting circuit 4. When the block includes a difference signal with the value 0, the offset detecting circuit 4 calculates a value for compensating data so that a dequantized value that is closest to 0 of those corresponding to the maximum value MAX and the minimum value MIN becomes 0. This value is referred to as an offset off. The offset detecting circuit 4 will be described later. The calculated offset off is supplied from the offset detecting circuit 4 to the DR, MIN' calculating circuit The DR, MIN' calculating circuit 7 calculates a dynamic range DR (=MAX−MIN) with the maximum value MAX and the minimum value MIN. In addition, with (MIN (−off=MIN'), the DR, MIN' calculating circuit 7 obtains a corrected minimum value MIN'. The DR, MIN' calculating circuit 7 supplies the calculated dynamic range DR and the minimum value MIN' to an ADRC (Adaptive Dynamic Range Coding) encoder 8. In addition, the difference signals are supplied from the input terminal 1 to the ADRC encoder 8 through a delaying circuit 5. The delaying circuit 5 delays the phases of the difference signals.

Figure 4A:
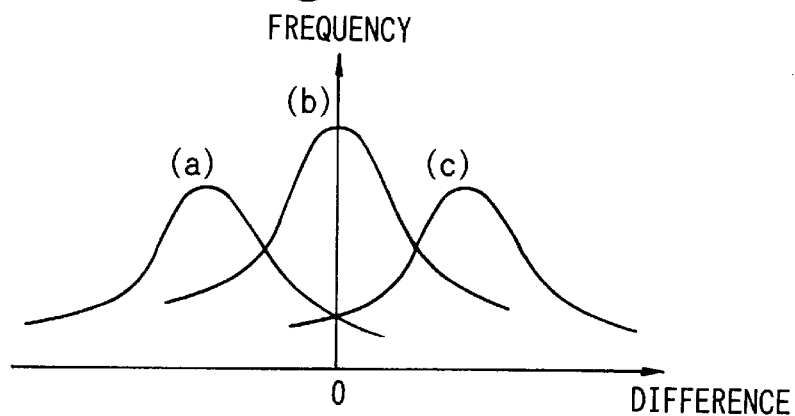
FIGS. 4A, 4B, and 4C are schematic diagrams for explaining calculations of offsets according to the embodiment of the present invention.
Figure 4B:
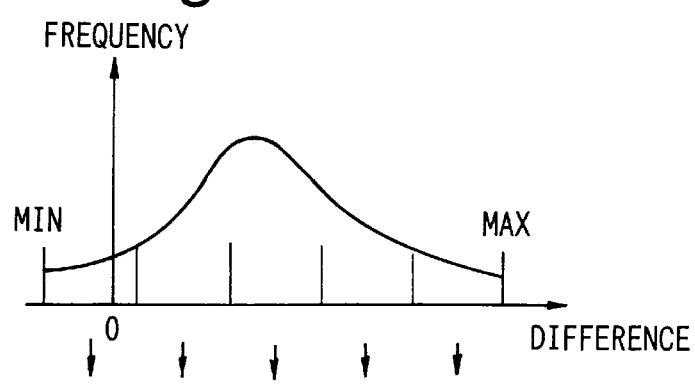
Figure 4C:
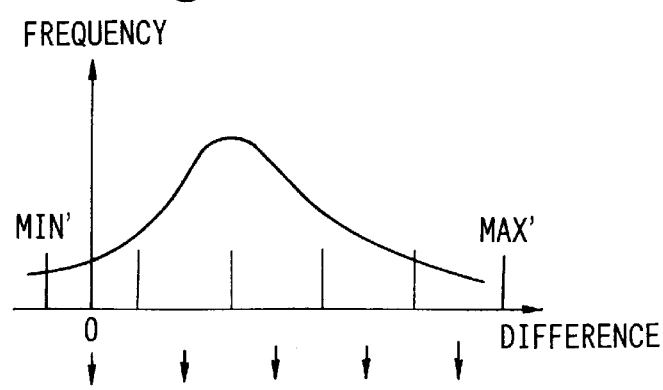

Next, with reference to FIGS. 4A, 4B, and 4C, an offset process performed for the maximum value MAX, the minimum value, and the dynamic range DR will be described. As described above, difference signals generated by the prediction encoding process deviate block by block as shown in FIG. 4A. In FIG. 4A, a difference signal a deviates on the negative side. A difference signal b does not deviate. In other words, the maximum frequency of the difference signal b accords with the value 0. A difference signal c deviates on the positive side. FIG. 4B shows the distribution of the frequency of difference signals of a particular block. When difference signals are quantized, the range between MAX and MIN is divided by 5. The same code is assigned to difference signals in each of the divided regions. When these codes are decoded, they are converted into a representative value that is the center value of each of the divided regions (denoted by arrows in FIG. 4B). Generally, when the number of bits of a code is n, the range between MAX and MIN is divided into $2^n$ regions.

As is clear from FIG. 4B, the value 0 of the difference signals deviates from the maximum frequency. It is important to match the value 0 of the difference signals with the maximum frequency so as to correctly restore the original signals. Otherwise, errors accumulate and thereby the picture quality remarkably deteriorates. To prevent the prediction errors from accumulating, it is preferable to periodically transmit original data for refreshing.

In this embodiment, the difference between a value that is closest to 0 of dequantized values and the value 0 is calculated as an offset off. The offset off is added to both the minimum value MIN and the maximum value MAX. Thus, as shown in FIG. 4C, values MIN' and MAX' of which the minimum value MIN and the maximum value MAX are shifted by the offset off are obtained. As a result, the value 0 of the difference signals can be represented with the value 0 of the dequantized values. At this point, the dynamic range DR is expressed by (MAX'−MIN'=(MAX−off)−(MIN off)= MAX−MIN). Thus, even if the offset is added, the dynamic range DR does not vary.

FIG. 5 shows an example of the structure of the offset detecting circuit 4. A maximum value and a minimum value of each block are supplied to a subtracting unit 21. The subtracting unit 21 subtracts MIN from MAX and calculates a dynamic range DR of the block. The dynamic range DR is supplied to a bit number determining circuit 22, a code detecting circuit 23, and a calculating circuit 24. The bit number determining circuit 22 determines the number of quantizing bits of the block corresponding to the dynamic range DR.

As with an ADRC encoder 8 (that will be described later), the bit number determining circuit 22 detects the number of quantizing bits n assigned to each block corresponding to the dynamic range DR. In other words, variable-length quantizing process or semi-fixed length quantizing process of which the number of quantizing bits n is assigned corresponding to the dynamic range DR and the minimum value MIN' is performed. Next, the semi-fixed length quantizing process in the case that the dynamic range DR is for example from 0 to 255 will be described. With the dynamic range DR and threshold values $T_1$ and $T_2$ that have the relation ($0<T_1<T_2<255$), the number of quantizing bits n assigned to each block is determined as follows.

$0 \leq DR \leq T_1$ ... n=0 (bit)
$T_1 < DR \leq T_2$ ... n=1 (bit)
$T_2 < DR \leq 255$ ... n=2 (bits)

The threshold value $T_1$ and $T_2$ are assigned so that the dynamic range DR is proportional to the maximum quantized distortion. This is because the quantized distortion that is recognizable by a human varies corresponding to the value of the dynamic range DR. With the maximum quantized distortion that is constant, the number of quantizing bits can be assigned.

The code detecting circuit 23 of the offset detecting circuit 4 generates a code with the determined number of bits n, the dynamic range DR, and the minimum value MIN corresponding to the following formulas.

DR=MAX−MIN

Quantizing step $\Delta = DR/2^n$ code=$[-MIN \times (2^n/DR)]=[-MIN/\Delta]$ where [ ] represents a function for obtaining an integer closest to the given value.

The calculating circuit 24 generates an offset off with the determined number of bits n, the dynamic range DR, the minimum value MIN, and the code corresponding to the following formula.

off=$MIN+code \times DR/2^n + DR/2^{n+1} = MIN+code \times \Delta + \Delta/2$

The dynamic range DR and the minimum value MIN' that was corrected by the offset off are supplied to the ADRC encoder 8 shown in FIG. 6. The difference signals supplied to the delaying circuit 5 are semifixed-length quantized. FIG. 6 shows an example of the structure of the ADRC encoder 8. As with the number-of-bits determining circuit 22 of the offset detecting circuit 4, a number-of-bits determining circuit 26 determines the number of quantizing bits assigned to each block with the dynamic range DR and the relation of the threshold values $T_1$ and $T_2$. The number of bits n and the dynamic range DR are supplied to a calculating circuit 27. The calculating circuit 27 calculates a quantizing step $\Delta$ (=$DR/2^n$).

The difference signals and MIN' are supplied to a subtracting circuit 28. The subtracting circuit 28 normalizes the difference signals with MIN'. The normalized difference signals are supplied from the subtracting circuit 28 to a quantizing unit 29. The quantizing step $\Delta$ is supplied to the quantizing unit 29. The quantizing unit 29 divides each of the normalized difference signals by the quantizing step $\Delta$, obtain an integer value of the resultant signal, and outputs a code q. Thus, the ADRC encoder 8 outputs the dynamic range DR and the minimum value MIN' for each block, and the code q for each pixel.

In this embodiment, the minimum value MIN' is subtracted from the difference signals so as to normalize the difference signals. However, instead, the normalizing process can be performed by subtracting the difference signals from the maximum value MAX'. When the dynamic range information is transmitted, any one of the dynamic range DR, the minimum value MIN', and the maximum value MAX' can be used.

Returning back to FIG. 2, the output data of the ADRC encoder 8 (namely, q, DR, and MIN') is supplied to a bit plane encoding circuit 9. The bit plane encoding circuit 9 divides the code q of n bits into bit planes. For example, when the number of bits n is 0, 1, and 2 (bits), the code q is divided into an MSB (most significant bit) plane and an LSB (least significant bit) plane. The MSB plane is a set of MSBs of two-bit quantized values that were supplied. On the other hand, the LSB plane is a set of LSBs of two-bit quantized values that were supplied. FIG. 7A shows one screen that is composed of (4×3=12 blocks), each block contains the code q of (4×4) different signals. Each of blocks that are not shown in FIG. 7A, 7B, and 7C contains the dynamic range DR of the block and the code q of the number of bits n that depends on the threshold values $T_1$, and $T_2$.

In FIG. 7A, for example, values 0, 1, 2, and 3 of the code q of 2 bits represent (00), (01), (10), and (11), respectively. In the example shown in FIG. 7A, the bit plane encoding circuit 9 divides the code q of one screen into the MSB plane and the LSB plane as shown in FIG. 7B. The LSB plane and the MSB plane generated by the bit plane encoding circuit 9 are supplied to dynamic range determining circuits 11a and 11b, respectively. The dynamic range determining circuits 11a and 11b compare the dynamic range DR with the threshold values $T_1$ and $T_2$ and determines the number of bits of the code q of the block. The output data of the dynamic range determining circuits 11a and 11b is supplied to memories 12a and 12b, respectively. When the maximum value of the number of bits n is 3, a third bit plane other than the MSB plane and the LSB plane is formed. In this case, as represented by boxed with dotted lines in FIG. 2, it is necessary to add a dynamic range determining circuit 11c and a memory 12c.

When the number of quantizing bits n is 0, 1, and 2 (bits), as shown in FIG. 8A, blocks with these bits co-exist in one screen. In the example shown in FIGS. 8A, 8B, and 8C, the number of blocks of one screen is (9×6) unlike with that shown in FIGS. 7A and 7B. The difference signals shown in FIG. 8A are divided into the MSB plane and the LSB plane as shown in FIG. 8B. In FIG. 8B, blank blocks represent all bits thereof are '0'. When 0 bit is assigned to blocks, all bits of the LSB plane and the MSB plane are '0'. When 1 bit is assigned to blocks, bits of blocks of the LSB plane are '0' or '1' and all bits of blocks of the MSB plane are '0'. When 2 bits are assigned to blocks, bits of blocks of the LSB plane and the MSB plane are not always '0'.

As described above, in this embodiment, blocks of which all bits are 0 are excluded from the variable-length-code encoding process. In other words, when these blocks are not transmitted, the amount of data to be transmitted is decreased. To exclude such blocks, the dynamic range determining circuits 11a and 11b and the memories 12a and 12b are disposed. In other words, as described above, the dynamic range determining circuit 11a determines the number of bits n of each block corresponding to the dynamic range DR. The LSB plane of each block that was determined as a 0 bit assigned block is not written to the memory 12a. Likewise, the MSB plane of each block that was determined as a 0 bit assigned block is not written to the memory 12b.

As a result of the excluding process, since blocks of which all bits are 0 are excluded, the resultant blocks with the code q are stored in the memories 12a and 12b in such a manner that the codes q are left justified as shown in FIG. 8C. Blocks are successively read from the highest line and leftmost position of the memories 12a and 12b. The last valid block on the highest line is detected by the determined results of the dynamic range determining circuits 11a and 11b. Next, blocks on the second line are successively read. After the last valid block on the lowest line is read, the data read operation for each bit plane is completed. Valid blocks are placed at earlier positions on the time axis.

Data read from the memories 12a and 12b is supplied to a variable-length-code encoding circuit 13. The variable-length-code encoding circuit 13 performs the run-length-code encoding process (for example, MMR (Modified MR) process) for each bit plane. The output data of the variable-length-code encoding circuit 13 is supplied to a framing circuit 10. Additional data (DR and MIN') for each block generated by the ADRC encoding process is supplied to the framing circuit 10. The additional data and output data of the variable-length-code encoding circuit 13 are output as data in a predetermined frame structure to an output terminal 14.

Another encoding method other than the ADRC method may be used. In this case, since data of blocks is always '0', an ID representing a removed block should be also transmitted. When the ADRC encoding method is used, since the dynamic range DR is used on the decoding side, such an ID is not required.

Figure 9:
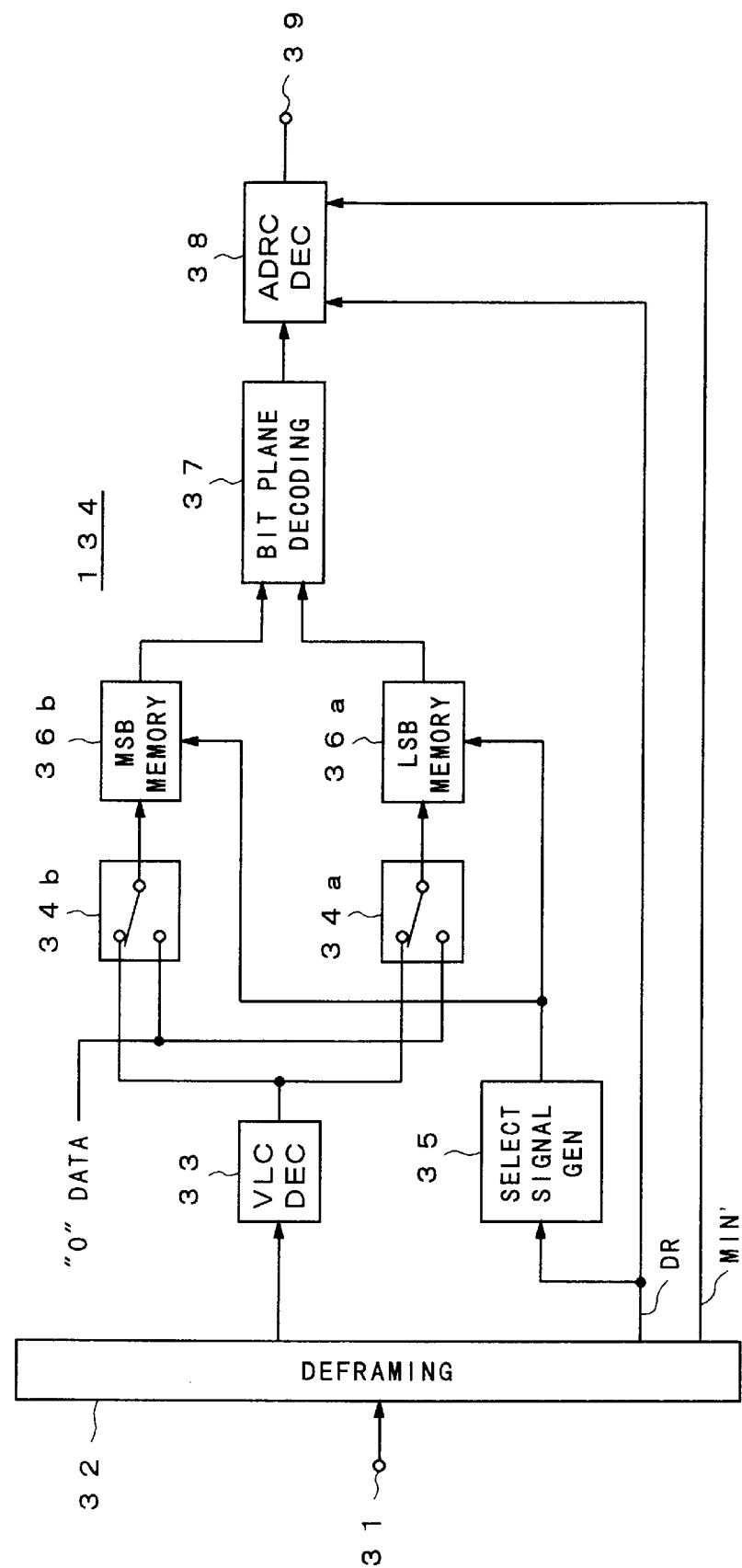
FIG. 9 is a block diagram showing the structure of a decoding unit according to the embodiment of the present invention.

Next, with reference to FIG. 9, an example of the decoding unit 134 of FIG. 2 will be described. Reproduced data as output data of the error correcting decoder 133 or received data is supplied to an input terminal 31 of the decoding unit 134. A deframing circuit 32 deframes a code of difference signals that was variable-length-code encoded, a dynamic range DR, and a minimum value MIN'. The code of the difference signals is decoded by a variable-length-code decoding circuit 33. The variable-length-code decoding circuit 33 corresponds to the variable-length-code encoding circuit 13.

The decoded output data of the variable-length-code decoding circuit 33 is supplied to input terminals of switching circuits 34a and 34b. '0' data is supplied to the other terminals of the switching circuits 34a and 34b. The output data of the switching circuits 34a and 34b is written to an LSB memory 36a and an MSB memory 36b, respectively. The switching circuits 34a and 34b are controlled corresponding to a select signal supplied from a select signal generating unit 35.

The select signal is generated corresponding to the dynamic range DR deframed by the deframing circuit 32. In other words, as described above, the number of bits n assigned to each block is detected with the dynamic range DR. Thus, it is known that blocks of which the number of bits n is 0 were excluded by the encoding unit 125. The switching circuit 34a adds '0' data to each block excluded on the LSB plane. The switching circuit 34b adds '0' data to each block excluded on the MSB plane. Thus, planes with added '0' data are written to the memories 36a and 36b.

The select signal is supplied to the memories 36a and 36b. When data is read from the memories 36a and 36b, they are controlled so that '0' data is placed at positions of blocks that were removed when the blocks were encoded. The LSB plane read from the LSB memory 36a and the MSB plane read from the MSB memory 36b are supplied to a bit plane decoding circuit 37. A bit plane decoding circuit 37 composites the two planes and outputs difference signals that were ADRC encoded.

The output data of the bit plane decoding circuit 37 is supplied to an ADRC decoder 38.

The dynamic range DR and the minimum value MIN' are supplied from the deframing circuit 32 to the ADRC decoder 38. The ADRC decoder 38 performs the reverse process of the ADRC encoder 8 (see FIG. 6). In other words, the ADRC encoder 8 determines the number of bits n of each block corresponding to the dynamic range DR, forms a quantizing step $\Delta$, multiplies the quantizing step $\Delta$ by the code signal q, and adds the minimum value MIN' and the multiplied result. A block segmented decoded difference signal is obtained from an output terminal 39. The value 0 of each of the decoded difference signals becomes 0. The decoded difference signals are supplied from the output terminal 39 to the block desegmenting circuit 125 (see FIG. 1).

Next, a hierarchical encoding apparatus according to a second embodiment of the present invention will be described. In the hierarchical encoding apparatus, data is predicated between hierarchical levels. In addition, by applying a simple arithmetic operation for data between hierarchical levels, the number of pixels to be encoded can be prevented from increasing.

Figure 10:
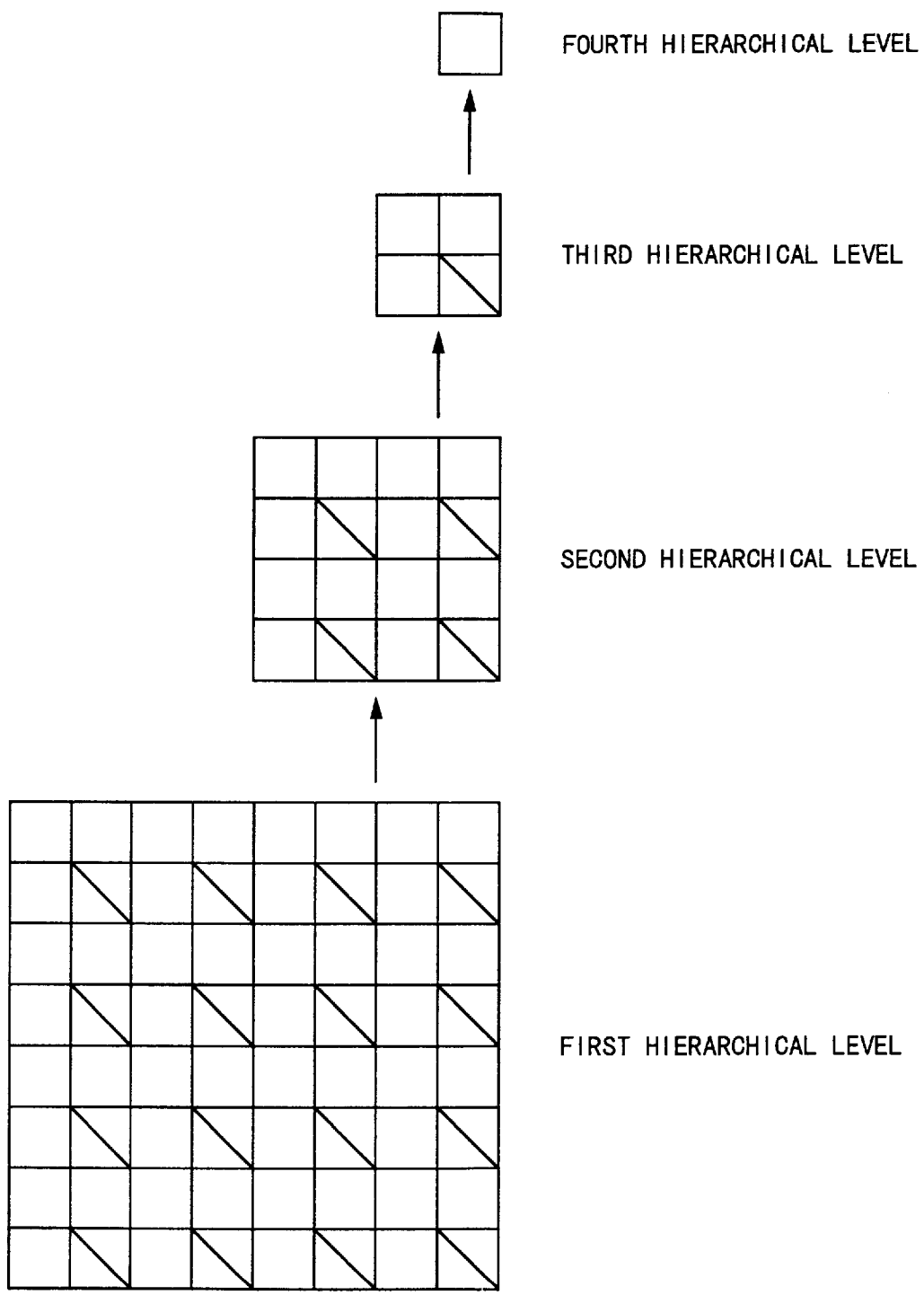
FIG. 10 is a schematic diagram for explaining an example of a hierarchical encoding process.

With reference to FIG. 10, the hierarchical encoding method will be described. FIG. 10 is a schematic diagram showing a four-level hierarchical structure having a first hierarchical level as the lowest hierarchical level (original picture) to a fourth hierarchical level as the highest hierarchical level. For example, when data of a higher hierarchical level is generated with the average value of four pixels of the lower hierarchical level that spatially corresponds thereto, the number of pixels to be transmitted can be prevented from increasing.

In other words, when data of the higher hierarchical level is denoted by M and pixel values of the lower hierarchical level are denoted by $x_0$, $x_1$, $x_2$, and $x_3$, data M is formed by the following formula.

$$M = \tfrac{1}{4} \cdot (x_0 + x_1 + x_2 + x_3)$$

The data M and three of four pieces of data (for example, other than $x_3$) are transmitted. On the receiving side or the reproducing side, the pixel $x_3$ that was not transmitted can be easily restored by the following simple arithmetic expression.

$$x_3 = 4 \cdot M - (x_0 + x_1 + x_2)$$

In FIG. 10, hatched squares represent pixels that are not transmitted.

FIG. 11 shows the structure of a five-level hierarchical encoding process corresponding to the above-described average calculating method. In this example, the first hierarchical level is a level of resolution of an input picture. The block size of the first hierarchical level is (1×1). Data of the second hierarchical level is generated by averaging of four pixels of data of the first hierarchical level. In this example, data $x_2(0)$ of the second hierarchical level is generated by averaging the data $x_1$ (0) to $x_1$ (3) of the first hierarchical level. Likewise, data $x_2$ (1) to $x_2$ (3) of the second hierarchical level adjacent to $x_2$ (0) are generated by averaging four pixels of the first hierarchical level. The block size of the second hierarchical level is (½×½).

Data of the third hierarchical level is generated by averaging four pixels of the second hierarchical level that spatially corresponds thereto. The block size of the third hierarchical level is (¼×¼). Likewise, data of the fourth hierarchical level is generated with data of the third hierarchical level. The block size of the fourth hierarchical level is (⅛×⅛). Last, data $x_5$ (0) of the fifth hierarchical level is generated by averaging data $x_4$ (0) to $x_4$ (3) of the fourth hierarchical level. The block size of the fifth hierarchical level is (1/16×1/16).

Figure 12:
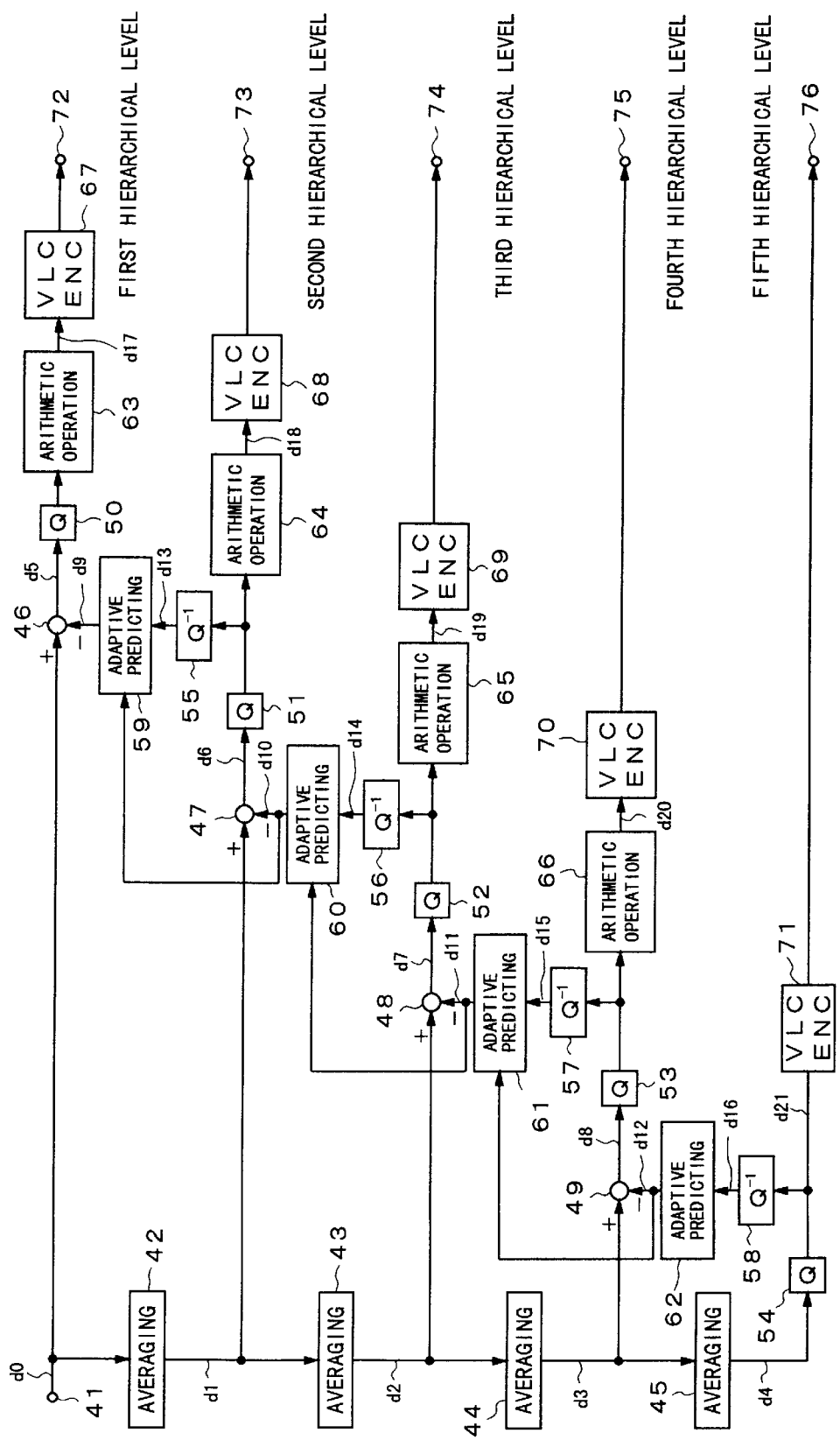
FIG. 12 is a block diagram showing an example of the structure of an encoding side performing the hierarchical encoding process according to a second embodiment of the present invention.

With hierarchically structured data that prevents the number of pixels to be encoded from increasing, by applying the class category adaptive predicting process for data of a higher hierarchical level, data of a lower hierarchical level is predicted and the difference (namely, the difference signals) between the data of the lower hierarchical level and the predicted value. Thus, the amount of data to be transmitted can be decreased. FIG. 12 shows the structure of an encoding unit that performs such a process. First hierarchical level data d0 as input picture data d0 is supplied from an input terminal 41 to an average calculating circuit 42 and a subtracting unit 46. The first hierarchical level data is picture data with the original resolution.

The average value calculating circuit 42 performs the ¼ average value calculating process for the input picture data d0 and generates hierarchical data d1. The hierarchical data d1 corresponds to the second hierarchical level data shown in FIG. 11. The generated hierarchical data d1 is supplied to an average value calculating circuit 43 and a subtracting unit 47.

The average calculating circuit 43 performs the same process as the average value calculating circuit 42 for the hierarchical data d1 and generates hierarchical data d2. The hierarchical data d2 corresponds to the third hierarchical level data. The generated hierarchical data d2 is supplied to an average value calculating circuit 44 and a subtracting unit 48. Likewise, the average value calculating circuit 44 performs the ¼ average value calculating process for the hierarchical data d2 and generates hierarchical data d3. The hierarchical data d3 corresponds to the fourth hierarchical level data. The generated hierarchical data d3 is supplied to an average value calculating circuit 45 and a subtracting unit 49. Likewise, the averaging circuit 45 performs the ¼ average value calculating process for the hierarchical data d3 and generates hierarchical data d4. The hierarchical data d4 corresponds to the fifth hierarchical level data. The generated hierarchical data d4 is supplied to a quantizing unit 54.

Hierarchical data of these five hierarchical levels is predicted between two hierarchical levels. The quantizing process for compressing data in the fifth hierarchical level is performed by the quantizing unit 54. Output data d21 of the quantizing unit 54 is supplied to a variable-length-code encoder 71 and a dequantizing unit 58. The output data of the encoder 71 is obtained as fifth hierarchical level data from an output terminal 76. Output data d16 of the dequantizing unit 58 is supplied to a class category adaptive predicting circuit 62.

The class category adaptive predicting circuit 62 performs the predicting process with the data d16 and generates a predicted value d12 of the fourth hierarchical level data. The predicted value d12 is supplied to a subtracting unit 49. The subtracting unit 49 obtains the difference value between the hierarchical data d3 supplied from the average value calculating circuit 44 and the predicted value d12 and supplies the obtained difference value d8 to a quantizing unit 53.

As with the quantizing unit 54, the quantizing unit 53 requantizes the difference value d8 in such a manner that the number of quantizing bits decreases. The output data of the quantizing unit 53 is supplied to a calculating unit 66 and a dequantizing unit 57. The calculating unit 66 performs the thin-out process for thinning out one of four pixels and supplies data d20 to a variable-length-code encoder 70. The variable-length-code encoder 70 encodes the data d20 that is output from the calculating unit 66. The output data of the encoder 70 is obtained as fourth hierarchical level data from an output terminal 75.

The fourth hierarchical level data d12 predicted by the class category adaptive predicting circuit 62 and the output data (decoded difference signal) d15 of the dequantizing unit 57 are supplied to a class category adaptive predicting circuit 61. The class category adaptive predicting circuit 61 adds the data d12 and the data d15, forms locally decoded data of the fourth hierarchical level, performs the predicting process with the locally decoded data, generates a predicted value d11 of the third hierarchical level data, and supplies the predicted value d11 to a subtracting unit 48. The subtracting unit 48 obtains the difference value between the data d2 supplied from the average value calculating circuit 43 and the predicted value d11 and supplies the difference value d7 to a quantizing unit 52.

The output data of the quantizing unit 52 is supplied to a calculating unit 65 and a dequantizing unit 56. The calculating unit 65 performs the thin-out process for thinning out one of four pixels and supplies third hierarchical level data d19 to a variable-length-code encoder 69. Output data of the encoder 69 is obtained as third hierarchical level data from an output terminal 74.

The third hierarchical level data d11 predicted by the class category adaptive predicting circuit 61 and output data d14 of the dequantizing unit 56 are supplied to a class category adaptive predicting circuit 60. The class category adaptive predicting circuit 60 adds the data d11 and the data d14, forms locally decoded data of the third hierarchical level, performs the predicting process with the locally decoded data, generates a predicted value d10 of the second hierarchical level, and supplies the predicted value d10 to the subtracting unit 47. The subtracting unit 47 obtains the difference value between the data d1 supplied from the average value calculating circuit 42 and the predicted value d10 and supplies the difference value d6 to a quantizing unit 51.

The output data of the quantizing unit 51 is supplied to a calculating unit 64 and a dequantizing unit 55. The calculating unit 64 performs the thin-out process for thinning out one of four pixels and supplies second hierarchical level data d18 to a variable-length-code encoder 68. The output data of the encoder 68 is obtained as second hierarchical level data from an output terminal 73.

The second hierarchical level data d10 predicted by the class category adaptive predicting circuit 60 and output data d13 of the dequantizing unit 55 are supplied to a class category adaptive predicting circuit 59. The class category adaptive predicting circuit 59 adds the data d10 and the data d13, forms locally decoded data of the second hierarchical level, performs the predicting process with the locally decoded data, generates a predicted value d9 of the first hierarchical level, and supplies the predicted value d9 to the subtracting unit 46. The subtracting unit 46 obtains the difference value between the input picture data d0 supplied from the input terminal 41 and the predicted value d9 and supplies the difference value d5 to a quantizing unit 50.

The output data of the quantizing unit 50 is supplied to a calculating unit 63. The calculating unit 63 performs the thin-out process for thinning out one of four pixels and supplies first hierarchical level data d17 to a variable-length-length code encoder 67. The output data of the encoder 67 is obtained as first hierarchical level data from an output terminal 72.

Figure 14:
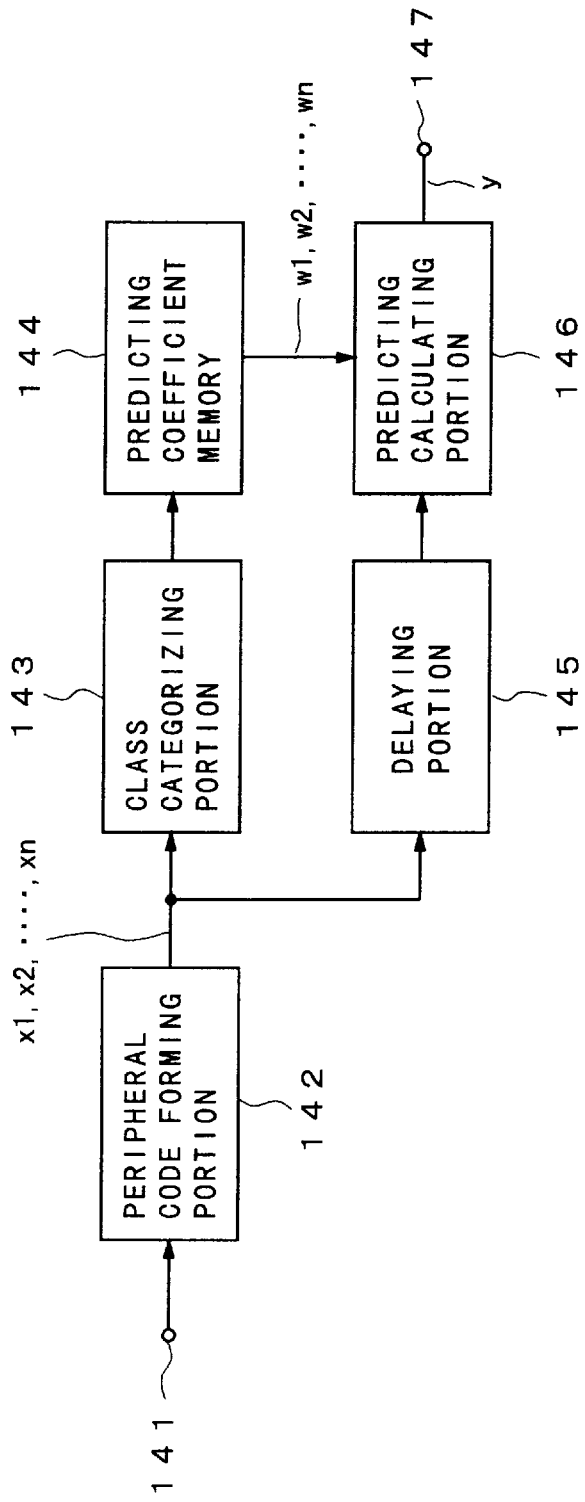
FIG. 14 is a block diagram showing an example of the structure of a class category adaptively predicting circuit according to the second embodiment of the present invention.

The class category adaptive predicting circuits 59, 60, 61, and 62 predict pixels of lower hierarchical levels corresponding to distributions of levels of a plurality of pixels spatially adjacent thereto (included in the higher hierarchical levels). FIG. 14 shows an example of the structure of the class category adaptive processing portion. An input signal is supplied from an input terminal 141 to a peripheral code forming portion 142. The peripheral code forming portion 142 forms a plurality of data $x_1, x_2, \ldots,$ and $x_n$ adjacent to a pixel to be predicted. The peripheral code values are supplied to a class categorizing portion 143 and a delaying portion 145. The class categorizing portion 143 outputs class codes corresponding to the patterns of distributions of the levels the peripheral code values $x_1$ to $x_n$. As the class codes, pheripheral code values may be used. However, since the number of classes becomes large, a technique for compressing bits of each peripheral code into one bit is used. An example of this technique is the ADRC method. The class codes generated by the class categorizing portion 143 are supplied to a predicting coefficient memory 144 as address signals.

The predicting coefficient memory 144 stores pre-learnt predicting coefficients $w_1$, to $w_n$ at individual addresses. In other words, with a teacher signal and an input signal, a predicted value is obtained by performing the linear combination for a plurality of pieces of data of the input signal and coefficients. A coefficient for minimizing the sum of square of the difference between the predicted value and the true value of the teacher signal is obtained by the method of least squares for each class. The predicting coefficients $w_1$ to $w_n$ read from the predicting coefficient memory 144 corresponding to class codes and the peripheral code values $x_1$ to $x_n$ supplied from the delaying portion 145 are supplied to a prediction calculating portion 146.

The prediction calculating portion 146 calculates a predicted value y by the following linear combination expression.

$$y = w_1 x_1 + w_2 \times x_2 + \ldots + w_n x_n$$

The predicted value y obtained by the prediction calculating portion 146 is obtained from an output terminal 147. The peripheral code values used for categorizing classes may be different from the peripheral code values used for the prediction calculating process.

The class category adaptive predicting circuits 59, 60, 61, and 62 categorize pixels of lower hierarchical levels as classes corresponding to distributions of levels of a plurality of pixels spatially adjacent thereto (included in higher hierarchical levels). Pre-learnt predicting coefficients for individual classes or a table for predicted values has been stored in a memory. A plurality of predicting coefficients corresponding to individual classes or one predicted value is read from the memory. The predicted value is used as it is. The predicting coefficients are used to generate a predicted value by performing the linear combination of the predicting coefficients and a plurality of pixels. Such a class category adaptive predicting method has been disclosed by the applicant of the present patent application as Japanese Patent Application No. 4-155719.

The same structure as the encoding unit 125 (see FIG. 2) according to the above-described embodiment is also disposed on the hierarchical code encoder side. In other words, each of the quantizing units 50, 51, 52, 53, and 54 has the same structure as the front portion of up to the ADRC encoder 8. In addition, each of the variable-length-code encoders 67, 68, 69, 70, and 71 has the same structure as the rear portion after the bit plane encoding circuit 9.

Figure 13:
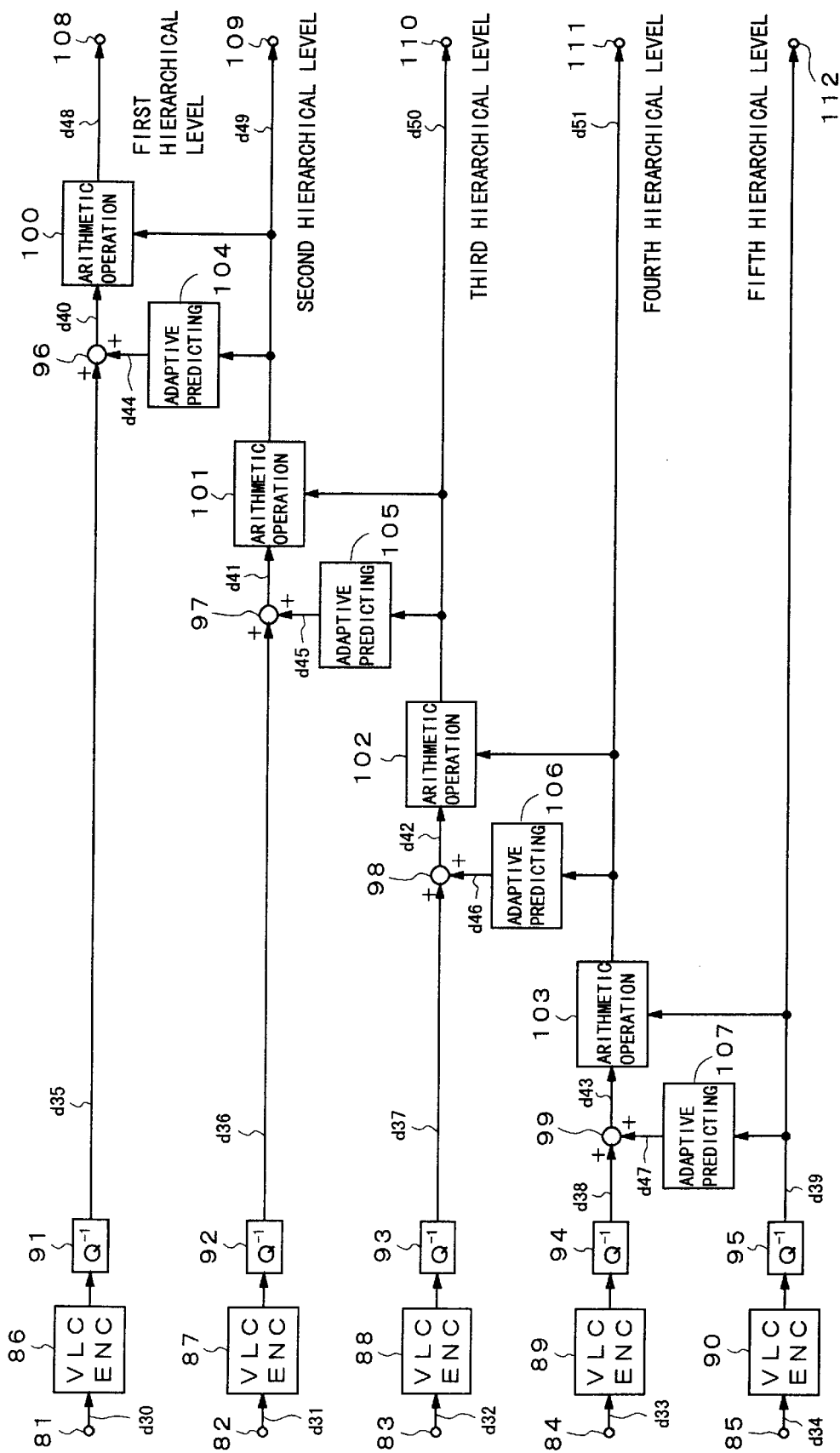
FIG. 13 is a block diagram showing an example of the decoding side according to the second embodiment of the present invention.

FIG. 13 shows an example of the structure of the hierarchical code decoder side corresponding to the above-described encoder. Data of each hierarchical level generated on the encoder side is supplied as d30 to d34 to input terminals 81, 82, 83, 84, and 85, respectively. Variable-length-code decoders 86, 87, 88, 89, and 90 performs the variable-length-code decoding process for the hierarchical data d30 to d34, respectively. The variable-length-code decoders 86, 87, 88, 89, and 90 are connected to dequantizing units 91, 92, 93, 94, and 95, respectively.

The dequantizing unit 95 dequantizes the fifth hierarchical input data d34 and supplies picture data d39 to a class category adaptive predicting circuit 107 and a calculating unit 103. The picture data d39 is obtained as picture output data of the fifth hierarchical level from an output terminal 112.

The class category adaptive predicting circuit 107 performs the class category adaptive predicting process for picture data of the fourth hierarchical level and generates a predicted value d47 of the fourth hierarchical level data. Data d38 (namely, a difference value) supplied from the dequantizing unit 94 and the predicted value d47 are added by an adding unit 99. Picture data d43 is supplied from the adding unit 99 to a calculating unit 103. The calculating unit 103 performs the above-described calculation for obtaining the value of each pixel that is not transmitted. With the picture data d39 supplied from the dequantizing unit 95 and the picture data d43, the calculating unit 103 restores all pixel values of the fourth hierarchical level. All the pixel values restored by the calculating unit 103 are supplied as picture data d51 to a class category adaptive predicting circuit 106 and a calculating unit 102. In addition, the picture data d51 is obtained as output data of the fourth hierarchical level from an output terminal 111.

The class category adaptive predicting circuit 106 performs the class category adaptive predicting process for picture data of the third hierarchical level and generates a predicted value d46 of the third hierarchical level data. Data d37 supplied from the dequantizing unit 93 and the predicted value d46 are added by an adding unit 98. The adding unit 98 supplies picture data d42 to the calculating unit 102. The calculating unit 102 obtains the value of each pixel that is not transmitted. With the picture data d51 supplied from the calculating portion 103 and the picture data d42, the calculating unit 102 restores all pixel values of the third hierarchical level. All the pixel values restored by the calculating portion 102 is supplied as picture data d50 to a class category adaptive predicting circuit 105 and a calculating portion 101. In addition, the picture data d50 is obtained as output data of the third hierarchical level from an output terminal 110.

The class category adaptive predicting circuit 105 performs the class category adaptive predicting process for picture data of the second hierarchical level and generates a predicted value d45 of the second hierarchical level data. Data d36 supplied from the dequantizing unit 92 and the predicted value d45 are added by an adding unit 97. The adding unit 97 supplies picture data d41 to the calculating unit 101. The calculating unit 101 obtains the value of each pixel that is not transmitted. With the pixel data d50 supplied from the calculating unit 102 and the picture data d41, the calculating unit 101 restores all pixel values of the second hierarchical level. All the pixel values restored by the calculating unit 101 are supplied as picture data d49 to a class category adaptive predicting circuit 104 and a calculating unit 100. In addition, the picture data d49 is obtained as output data of the second hierarchical level from an output terminal 109.

The class category adaptive predicting circuit 104 performs the class adaptive predicting process for picture data of the first hierarchical level and generates a predicted value d44 of the first hierarchical level data. Data d35 supplied from the dequantizing unit 91 and the predicted value 44 are added by an adding unit 96. The adding unit 96 supplies picture data d40 to the calculating unit 100. The calculating unit 100 obtains the value of each pixel that is not transmitted. With the pixel data d49 supplied from the calculating unit 101 and the picture data d40, the calculating unit 100 restores all pixel values of the first hierarchical level. All the pixel values as picture data d48 restored by the calculating unit 100 are obtained as output data of the first hierarchical level from an output terminal 108. Thus, in the hierarchical encoding process for preventing the number of pixels to be encoded from increasing, with the class category adaptive predicting process, the encoding efficiency can be improved.

Each of the variable-length-code decoders 86, 87, 88, 89, and 90 and the dequantizing units 91, 92, 93, 94, and 95 has the same structure as the decoding unit 134 according to the above-described embodiment. Thus, as with the above-described first embodiment, in the second embodiment of which the present invention is applied for the above-described hierarchical encoding process, data of blocks to which 0 bit is assigned is not transmitted and thereby the amount of data can be further decreased.

In addition, the present invention can be applied for the quantizing process for quantizing a difference signal generated by other than the prediction encoding process. Moreover, the present invention can be applied for a system having a buffering structure that controls the quantizing step width and thereby the amount of data generated.

According to the present invention, since planes of which bit values are 0 are removed, the amount of data to be transmitted can be further decreased.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. An information signal encoding apparatus for encoding an input digital information signal such that the amount of data generated decreases, comprising:

means for generating a difference signal representing the difference between sample values of the input digital information signal;

means for block segmenting the difference signal;

first variable-length-code encoding means for quantizing the block segmented difference signal with the number of quantizing bits determined for each block; and second variable-length-code encoding means for dividing output data of said first variable-length-code encoding means into bit planes, removing data of each block to which 0 bits are assigned to each of the bit planes, the number of bits assigned to the bit planes of each block defining the number of quantizing bits of said first variable-length-code encoding means, and variable-length-code encoding the resultant bit planes.

2. The information signal encoding apparatus as set forth in claim 1, wherein said first variable-length-code encoding means comprises:

means for detecting a maximum value and a minimum value of a plurality of difference signals contained in the block;

means for detecting a dynamic range of the block with the maximum value and the minimum value;

means for forming corrected input data corrected in such a manner that the corrected input data has a relative level based on a value defining the dynamic range; and means for quantizing the corrected input data with the number of quantizing bits defined by the dynamic range, the number of quantizing bits defined by the dynamic range being smaller than the number of quantizing bits that has been originally predetermined.

3. The information signal encoding apparatus as set forth in claim 2,
wherein said second variable-length-code encoding means is adapted for removing data of the block to which 0 bits are assigned to each of the bit planes, the number of bits assigned to the bit planes of each block corresponding to the dynamic range and for variable-length-code encoding the resultant bit plane.

4. The information signal encoding apparatus as set forth in claim 1,
wherein said first variable-length-code encoding means is adapted for correcting data in such a manner that the value 0 of the difference signal accords with the value 0 of the dequantized value.

5. The information signal encoding apparatus as set forth in claim 1, wherein said second-variable-length-code encoding means inserts a transmitting flag in place of each removed block.

6. An information signal encoding method for encoding an input digital information signal such that the amount of data generated decreases, comprising the steps of:
(a) generating a difference signal representing the difference between sample values of the input digital information signal;
(b) block segmenting the difference signal;
(c) quantizing the block segmented difference signal with the number of quantizing bits determined for each block; and
(d) dividing output data of the step (c) into bit planes, removing data of each block to which 0 bits are assigned to each of the bit planes, the number of bits assigned to the bit planes of each block defining the number of quantizing bits of said first variable-length-code encoding means, and variable-length-code encoding the resultant bit planes.

7. The information signal encoding method as set forth in claim 6,
wherein said step of quantizing comprises:
detecting a maximum value and a minimum value of a plurality of difference signals contained in the block;
detecting a dynamic range of the block with the maximum value and the minimum value;
forming corrected input data corrected in such a manner that the corrected input data has a relative level based on a value defining the dynamic range; and
quantizing the corrected input data with the number of quantizing bits defined by the dynamic range, the number of quantizing bits defined by the dynamic range being smaller than the number of quantizing bits that has been originally predetermined.

8. The information signal encoding method as set forth in claim 7,
wherein said step of dividing removes data of the block to which 0 bits are assigned to each of the bit planes, the number of bits assigned to the bit planes of each block corresponding to the dynamic range and for variable-length-code encoding the resultant bit plane.

9. The information signal encoding method as set forth in claim 6,
wherein said step of quantizing is adapted for correcting data in such a manner that the value 0 of the difference signal accords with the value 0 of the dequantized value.

10. The information signal encoding method as set forth in claim 6, further comprising the step of inserting a transmitting flag in place of each removed block.

11. An information signal encoding apparatus for generating at least first hierarchical data and second hierarchical data by an input digital information signal, encoding the first hierarchical data and the second hierarchical data, and transmitting the encoded data, comprising:
means for forming the second hierarchical data with a resolution lower than the first hierarchical data;
means for predicting the first hierarchical data with the second hierarchical data;
means for forming a difference signal representing the difference between the predicted data and the first hierarchical data;
means for block segmenting the difference signal;
first variable-length-code encoding means for quantizing the block segmented difference signal with the number of quantizing bits determined for each of the blocks; and
second variable-length-code encoding means for dividing output data of said first variable-length-code encoding means into bit planes, removing data of each block to which 0 bits are assigned to each of the bit planes, the number of bits assigned to the bit planes of each block defining the number of quantizing bits of said first variable-length-code encoding means, and variable-length-code encoding the resultant bit planes.

12. The information signal encoding apparatus as set forth in claim 11,
wherein said first variable-length-code encoding means comprises:
means for detecting a maximum value and a minimum value of a plurality of difference signals contained in the block;
means for detecting a dynamic range of the block as a function of the maximum value and the minimum value;
means for forming corrected input data with a relative level based on a value defining the dynamic range; and
means for quantizing the corrected input data with the number of quantizing bits defined by the dynamic range, which number is smaller than the defined number of quantizing bits.

13. The information signal encoding apparatus as set forth in claim 12,
wherein said second variable-length-code encoding means is adapted for removing data of the block to which 0 bits are assigned to each of the bit planes, said number of bits assigned to the bit planes of each block corresponding to the dynamic range and for variable-length-code encoding the resultant bit plane.

14. The information signal encoding apparatus as set forth in claim 11,
wherein said first variable-length-code encoding means is adapted for correcting data in such a manner that the value 0 of the difference signal accords with the value 0 of the dequantized value.

15. The information signal encoding apparatus as set forth in claim 11, wherein said second-variable-length-code encoding means inserts a transmitting flag in place of each removed block.

16. An information signal encoding method for generating at least first hierarchical data and second hierarchical data by an input digital information signal, encoding the first hierarchical data and the second hierarchical data, and transmitting the encoded data, comprising the steps of:

(a) forming the second hierarchical data with a resolution lower than the first hierarchical data;

(b) predicting the first hierarchical data with the second hierarchical data;

(c) forming a difference signal representing the difference between the predicted data and the first hierarchical data;

(d) block segmenting the difference signal;

(e) quantizing the block segmented difference signal with the number of quantizing bits determined for each of blocks; and (f) dividing output data of the step (e) into bit planes, removing data of each block to which 0 bits are assigned to each of the bit planes, the number of bits assigned to the bit planes of each block defining the number of quantizing bits of the step (e), and variable-length-code encoding the resultant bit planes.

17. The information signal encoding method as set forth in claim 16, wherein said step of quantizing comprises:

detecting a maximum value and a minimum value of a plurality of difference signals contained in the block;

detecting a dynamic range of the block as a function of the maximum value and the minimum value;

forming corrected input data with a relative level based on a value defining the dynamic range; and quantizing the corrected input data with the number of quantizing bits defined by the dynamic range, which number is smaller than the defined number of quantizing bits.

18. The information signal encoding apparatus as set forth in claim 17, wherein said step of dividing removes data of the block to which 0 bits are assigned to each of the bit planes, said number of bits assigned to the bit planes of each block corresponding to the dynamic range; and variable-length encodes the resultant bit planes.

19. The information signal encoding apparatus as set forth in claim 16, wherein said step of quantizing corrects data in such a manner that the value 0 of the difference signal accords with the value 0 of the dequantized value.

20. The information signal encoding method as set forth in claim 16, further comprising the step of inserting a transmitting flag in place of each removed block.

21. An information signal decoding method for decoding an encoded difference signal of which a difference signal has been quantized by a first variable-length-code encoding process and each of bit planes of the encoded difference signal has been encoded by a second variable-length-code encoding process, comprising the steps of:

(a) decoding data of a block that has been removed which has 0 bits assigned in each of the bit planes, the number of bits assigned to the bit planes of each block defining the number of quantizing bits of the first variable-length-code encoding process, decoding the variable length code, and compositing the decoded bit planes;

(b) variable-length-code decoding the data of the composited bit planes; and (c) block-desegmenting the decoded difference signal and restoring data of the original sequence.

22. The information signal decoding method as set forth in claim 21, wherein the difference signal had been quantized by detecting a maximum value and a minimum value of a plurality of difference signals contained in the block, a dynamic range of the block had been detected with the maximum value and the minimum value, corrected input data having a relative level based on a value defining the dynamic range had been formed, and the corrected input data had been quantized with the number of quantizing bits defined by the dynamic range, which number is smaller than the number of quantizing bits, the step of decoding comprising:

de-quantizing the corrected input data with the number of quantizing bits defined by the dynamic range;

uncorrecting the corrected input data so as to remove the relative level based on a value defining the dynamic range, determining the maximum and minimum values from the dynamic range of the block; and determining difference signals from said maximum and minimum values.

23. The information signal decoding method as set forth in claim 21, wherein the step of decoding decodes a transmitting flag flagging the position of a removed block.

24. A picture record medium for recording an encoded signal of which an input digital information signal has been encoded the amount of data generated decreases, the picture record medium having a record region for recording the encoded signal, the encoded signal being generated by an information signal encoding apparatus, the information signal encoding apparatus comprising:

means for generating a difference signal representing the difference between sample values of the input digital information signal;

means for block segmenting the difference signal;

first variable-length-code encoding means for quantizing the block segmented difference signal with the number of quantizing bits determined for each block; and second variable-length-code encoding means for dividing output data of said first variable-length-code encoding means into bit planes, removing data of each block to which 0 bits are assigned to each of the bit planes, the number of bits assigned to the bit planes of each block defining the number of quantizing bits of said first variable-length-code encoding means, and variable-length-code encoding the resultant bit planes.

25. The picture record medium as set forth in claim 24, wherein said second-variable-length-code encoding means inserts a transmitting flag in place of each removed block.

26. An information signal encoding apparatus for encoding an input digital information signal such that the amount of data generated decreases, means for generating a difference signal representing the difference between sample values of the input digital information signal;

means for block segmenting the difference signal;

means for ADRC encoding the block segmented difference signal;

means for correcting data such that the value 0 of the difference signal accords with the value 0 of the dequantized value, said ADRC encoding means comprising:

means for detecting a maximum value and a minimum value of plurality of difference signals contained in the block;

means for detecting a dynamic range of the block with the maximum value and the minimum value;

means for forming corrected input data corrected such that the corrected input data has a relative level based on a value defining the dynamic range; and means for quantizing the corrected input data with the number of quantizing bits defined by the dynamic range, the number of quantizing bits defined by the dynamic range being smaller than the number of quantizing bits that has been originally predetermined.

27. An information signal decoding apparatus for decoding an input digital information signal which had been encoded by generating a difference signal representing the difference between sample values of the input digital information signal, block segmenting the difference signal, quantizing the block segmented difference signal with a number of quantizing bits determined for each block, dividing the quantized data into bit planes, with each block to which 0 bits were assigned to each of the bit planes having been removed and with the number of bits assigned to the bit planes of each block defining said number of quantizing bits during quantization, and encoding the resultant bit planes, the apparatus comprising:

first variable-length-code decoding means for decoding said resultant bit planes, for generating blocks corresponding to the removed blocks to which 0 bits were assigned to each of the bit planes, and for compositing the generated blocks with the decoded bit planes to thereby produce the quantized block segmented difference signal;

second variable-length-code decoding means for de-quantizing said quantized block segmented difference signal using said number of quantizing bits determined for each block to thereby produce said block segmented difference signal;

means for block de-segmenting the block segmented difference signal to thereby produce said difference signal; and means for calculating said input digital information signal from said difference signal.

28. The information signal decoding apparatus as set forth in claim 27, wherein quantization during encoding is performed by detecting a maximum value and a minimum value of a plurality of difference signals contained in the block, detecting a dynamic range of the block with the maximum value and the minimum value, forming corrected input data with a relative level based on a value defining the dynamic range, and quantizing the corrected input data with the number of quantizing bits defined by the dynamic range and which number is smaller than the defined number of quantizing bits, wherein said second variable-length-code decoding means comprises:

means for de-quantizing the quantized corrected input data with the number of quantizing bits defined by the dynamic range;

means for uncorrecting the corrected input data so as to remove the value defining the dynamic range;

means for determining the maximum and minimum values from the dynamic range of the block; and means for determining said block segmented difference signal from said maximum and minimum values.

29. The information signal decoding apparatus as set forth in claim 27, wherein said first-variable-length-code decoding means decodes a transmitting flag flagging the position of a removed block.

30. An information signal decoding apparatus for decoding a signal that had been encoded by generating at least first hierarchical data and second hierarchical data from an input digital information signal, the second hierarchical data having been formed with a resolution lower than the first hierarchical data, and the second hierarchical data having been used to predict the first hierarchical data, forming a difference signal representing the difference between the predicted hierarchical data and the first hierarchical data, block segmenting the difference signal, quantizing the segmented difference signal with a number of quantizing bits determined for each of the blocks, dividing the quantized segmented difference signal into bit planes, with each block to which 0 bits were assigned to each of the bit planes having been removed and with the number of bits assigned to the bit planes of each block defining the number of quantizing bits of a variable-length-code encoding means which encoded the resultant bit planes, the apparatus comprising:

first variable-length-code decoding means for decoding said resultant bit planes, generating blocks corresponding to the removed blocks to which 0 bits were assigned to each of the bit planes, and composing the generated blocks with the decoded bit planes to thereby obtain a quantized block segmented difference signal;

second variable-length-code decoding means for dequantizing the quantized block segmented difference signal with the number of quantizing bits determined for each of the blocks to thereby obtain the block segmented difference signal;

means for block de-segmenting the block segmented difference signal to thereby obtain the difference signal representing the difference between the predicted hierarchical data and the first hierarchical data;

means for determining the predicted hierarchical data and the first hierarchical data from said difference signal; and means for determining the second hierarchical data from the first hierarchical data and the predicted hierarchical data.

31. The information signal decoding apparatus as set forth in claim 30, wherein quantization during encoding is performed by detecting a maximum value and a minimum value of a plurality of difference signals contained in the block, detecting a dynamic range of the block with the maximum value and the minimum value, forming corrected input data with a relative level based on a value defining the dynamic range, and quantizing the corrected input data with the number of quantizing bits defined by the dynamic range and which number is smaller than the defined number of quantizing bits, wherein said second variable-length-code decoding means comprises:

means for de-quantizing the quantized corrected input data with the number of quantizing bits defined by the dynamic range;

means for uncorrecting the corrected input data so as to remove the value defining the dynamic range;

means for determining the maximum and minimum values from the dynamic range of the block; and means for determining said block segmented difference signal from said maximum and minimum values.

32. The information signal decoding apparatus as set forth in claim 30, wherein said first-variable-length-code decoding means decodes a transmitting flag flagging the position of a removed block.

33. An information signal decoding apparatus for decoding a signal that had been encoded by generating at least first hierarchical data and second hierarchical data from an input digital information signal, the second hierarchical data having been formed with a resolution lower than the first hierarchical data, and the second hierarchical data having been used to predict the first hierarchical data, forming a difference signal representing the difference between the predicted hierarchical data and the first hierarchical data, the difference signal being block segmented and quantized with a number of quantizing bits determined for each of the blocks, dividing the quantized block segmented signal into bit planes with each block to which 0 bits are assigned to each of the bit planes having been removed, and with the number of bits assigned to the bit planes of each block defining the number of quantizing bits, and encoding the resultant bit planes, the apparatus comprising:

means for variable-length-code decoding the encoded resultant bit planes, for generating blocks corresponding to the removed blocks to which 0 bits were assigned to the bit planes, and composing the generated blocks with the decoded resultant bit planes to thereby obtain the quantized block segmented signal;

means for de-quantizing the quantized block segmented signal with the number of quantizing bits determined for each of the blocks to thereby obtain the block segmented difference signal;

means for block de-segmenting the block segmented difference signal to thereby obtain the difference signal representing the difference between the predicted hierarchical data and the first hierarchical data;

means for determining the predicted hierarchical data and the first hierarchical data from the difference signal; and means for calculating the second hierarchical data from the first hierarchical data and the predicted hierarchical data.

34. The information signal decoding apparatus as set forth in claim 33, wherein quantization during encoding is performed by detecting a maximum value and a minimum value of a plurality of difference signals contained in the block, detecting a dynamic range of the block with the maximum value and the minimum value, forming corrected input data with a relative level based on a value defining the dynamic range, and quantizing the corrected input data with the number of quantizing bits defined by the dynamic range and which number is smaller than the defined number of quantizing bits, wherein said second variable-length-code decoding means comprises:

means for de-quantizing the quantized corrected input data with the number of quantizing bits defined by the dynamic range;

means for uncorrecting the corrected input data so as to remove the value defining the dynamic range;

means for determining the maximum and minimum values from the dynamic range of the block; and means for determining said block segmented difference signal from said maximum and minimum values.

35. The information signal decoding apparatus as set forth in claim 33, wherein said means for variable-length-code decoding decodes a transmitting flag flagging the position of a removed block.

36. An information signal decoding method for decoding a signal that had been encoded by generating at least first hierarchical data and second hierarchical data from an input digital information signal, the second hierarchical data having been formed with a resolution lower than the first hierarchical data, and the second hierarchical data having been used to predict the first hierarchical data, forming a difference signal representing the difference between the predicted hierarchical data and the first hierarchical data, block segmenting the difference signal, quantizing the block segmented difference signal with a number of quantizing bits determined for each of the blocks, dividing the quantized segmented difference signal into bit planes, with each block to which 0 bits were assigned to each of the bit planes having been removed and with the number of bits assigned to the bit planes of each block defining the number of quantizing bits of a variable-length-code encoding means which encoded the resultant bit planes, the method comprising the steps of:

variable-length-code decoding the transmitted encoded data, generating blocks corresponding to the removed blocks to which 0 bits were assigned to each of the bit planes, and composing the generated blocks with the decoded bit planes to thereby obtain the quantized block segmented difference signal;

de-quantizing the quantized block segmented difference signal with the number of quantizing bits determined for each of the blocks to thereby obtain the block segmented difference signal;

block de-segmenting the block segmented difference signal to thereby obtain the difference signal representing the difference between the predicted hierarchical data and the first hierarchical data; determining the predicted hierarchical data and the first hierarchical data from the difference signal; and determining the second hierarchical data from the predicted hierarchical data and the first hierarchical data.

37. The information signal decoding method as set forth in claim 36, wherein the difference signal was quantized by detecting a maximum value and a minimum value of a plurality of difference signals contained in the block, detecting a dynamic range of the block with the maximum value and the minimum value, forming corrected input data with a relative level based on a value defining the dynamic range, and quantizing the corrected input data with the number of quantizing bits defined by the dynamic range and which number is smaller than the defined number of quantizing bits, the step of decoding comprising:

de-quantizing the corrected input data with the number of quantizing bits defined by the dynamic range;

uncorrecting the corrected input data so as to remove a value defining the dynamic range;

determining the maximum and minimum values from the dynamic range of the block; and determining said block segmented difference signal from said maximum and minimum values.

38. The information signal decoding method as set forth in claim 36, wherein said step of variable-length-code decoding decodes a transmitting flag flagging the position of a removed block.

39. An information signal decoding method for decoding a signal that had been encoded by generating at least first hierarchical data and second hierarchical data from an input digital information signal, the second hierarchical data having been formed with a resolution lower than the first hierarchical data, and the second hierarchical data having been used to predict the first hierarchical data, forming a difference signal representing the difference between the predicted hierarchical data and the first hierarchical data, block segmenting the difference signal, quantizing the block segmented difference signal with a number of quantizing bits determined for each of the blocks, dividing the quantized block segmented difference signal into bit planes, with each block to which 0 bits were assigned to each of the bit planes having been removed, and with the number of bits assigned to the bit planes of each block defining the number of quantizing bits, and encoding the resultant bit planes, the method comprising the steps of:

variable-length-code decoding the resultant bit planes, generating blocks corresponding to the removed blocks to which 0 bits were assigned to each of the bit planes, and composing the generated blocks with the decoded bit planes to thereby obtain the quantized block segmented difference signal;

de-quantizing the quantized block segmented difference signal with the number of quantizing bits determined for each of the blocks to thereby obtain the block segmented difference signal;

block de-segmenting the block segmented difference signal to thereby obtain the difference signal representing the difference between the predicted hierarchical data and the first hierarchical data;

determining the predicted hierarchical data and the first hierarchical data from the difference signal; and determining the second hierarchical data from the first hierarchical data and the predicted hierarchical data.

40. The information signal decoding method as set forth in claim 39, wherein the difference signal was quantized by detecting a maximum value and a minimum value of a plurality of difference signals contained in the block, a dynamic range of the block was detected with the maximum value and the minimum value, corrected input data was formed with a relative level based on a value defining the dynamic range, and the corrected input data was quantized with the number of quantizing bits defined by the dynamic range, which number is smaller than the defined number of quantizing bits, the step of decoding comprising:

de-quantizing the corrected input data with the number of quantizing bits defined by the dynamic range;

uncorrecting the corrected input data so as to remove a value defining the dynamic range;

determining the maximum and minimum values from the dynamic range of the block; and determining said block segmented difference signal from said maximum and minimum values.

41. The information signal decoding method as set forth in claim 39, wherein said step of variable-length-code decoding decodes a transmitting flag flagging the position of a removed block.

42. An information signal encoding method for encoding an input digital information signal such that the amount of data generated decreases, said method comprising the steps of:

generating a difference signal representing the difference between sample values of the input digital information signal;

block segmenting the difference signal to thereby obtain a block segmented difference signal;

ADRC encoding the block segmented difference signal by detecting a maximum value and a minimum value of a plurality of difference signals contained in the block; detecting a dynamic range of the block as a function of the maximum value and the minimum value; forming corrected input data with a relative level based on a value defining the dynamic range; and quantizing the corrected input data with a number of defined quantizing bits defined by the dynamic range, said number being smaller than the number of quantizing bits; and correcting a respective block segmented difference signal which includes a difference signal having the value 0 such that a dequantized signal of said respective block segmented difference signal quantized by said ADRC encoding accords with the value of 0.

43. An information signal decoding apparatus for decoding an input digital information signal which had been encoded by generating a difference signal representing the difference between sample values of the input digital information signal, block segmenting the difference signal, ADRC encoding the block segmented difference signal by detecting a maximum value and a minimum value of a plurality of difference signals contained in the block, detecting a dynamic range of the block as a function of the maximum value and the minimum value, forming corrected input data with a relative level based on a value defining the dynamic range, and quantizing the corrected input data with a number of quantizing bits defined by the dynamic range, said number being smaller than the number of defined quantizing bits, and wherein a respective block segmented difference signal which includes a difference signal having the value 0 is corrected such that a dequantized signal of said respective block segmented difference signal quantized by said ADRC encoding accords with the value of 0, the apparatus comprising:

means for uncorrecting the corrected ADRC encoded signal;

means for determining the plurality of difference signals contained in the block from the maximum and minimum values;

ADRC decoding means for decoding the block segmented difference signal;

block de-segmenting means for block de-segmenting the decoded difference signal; and means for determining the input digital information from the de-segmented difference signal;

and wherein said ADRC decoding means comprising:

means for de-quantizing the encoded input digital information signal to thereby obtain the corrected input data with the number of quantizing bits defined by the dynamic range;

means for uncorrecting said corrected input data to remove the relative level based on the value defining the dynamic range; and means for determining the maximum and minimum values from the dynamic range of the block.

44. An information signal decoding method for decoding an input digital information signal which had been encoded by generating a difference signal representing the difference between sample values of the input digital information signal, block segmenting the difference signal, ADRC encoding the block segmented difference signal by detecting a maximum value and a minimum value of a plurality of difference signals contained in the block, detecting a dynamic range of the block as a function of the maximum value and the minimum value, forming corrected input data with a relative level based on a value defining the dynamic range, and quantizing the corrected input data with a number of quantizing bits defined by the dynamic range, said number being smaller than the number of defined quantizing bits, and wherein a respective block segmented difference signal which includes a difference signal having the value 0 is corrected such that a dequantized signal of said respective block segmented difference signal quantized by said ADRC encoding accords with the value of 0, the method comprising the steps of:

ADRC decoding the uncorrected block segmented difference signal by de-quantizing the corrected input data with the number of quantizing bits defined by the dynamic range, uncorrecting the corrected input data whose relative level is based on the value defining the dynamic range, and determining the maximum and minimum values from the dynamic range of the block;

determining the difference signal contained in the block from the maximum and minimum values;

block de-segmenting the difference signal; and determining the input digital information signal from the difference signal.

\* \* \* \* \*